(12) United States Patent
Leon-Salas

(10) Patent No.: US 12,143,152 B2
(45) Date of Patent: Nov. 12, 2024

(54) SYSTEMS AND METHODS FOR LIGHT COLLECTION AND DISTRIBUTION

(71) Applicant: Purdue Research Foundation, West Lafayette, IN (US)

(72) Inventor: Walter Daniel Leon-Salas, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 17/962,058

(22) Filed: Oct. 7, 2022

(65) Prior Publication Data

US 2023/0283371 A1 Sep. 7, 2023

Related U.S. Application Data

(60) Continuation of application No. 17/379,994, filed on Jul. 19, 2021, now Pat. No. 11,469,818, which is a
(Continued)

(51) Int. Cl.
*H04B 10/11* (2013.01)
*H02J 7/35* (2006.01)
(Continued)

(52) U.S. Cl.
CPC ............. *H04B 10/11* (2013.01); *H02J 7/35* (2013.01); *H02M 3/156* (2013.01); *H02S 40/30* (2014.12); *H02S 99/00* (2013.01); *H04B 10/516* (2013.01); *H04B 10/806* (2013.01); *H04B 10/40* (2013.01); *H04B 10/50* (2013.01)

(58) Field of Classification Search
None
See application file for complete search history.

(56) References Cited

U.S. PATENT DOCUMENTS

| 2007/0044837 A1 | 3/2007 | Simburger et al. |
| 2015/0351177 A1 | 12/2015 | Leon-Salas |
| 2017/0019180 A1 | 1/2017 | Lucrecio et al. |

FOREIGN PATENT DOCUMENTS

CN 104715272 A 6/2015

OTHER PUBLICATIONS

Huber, "Electroreflectance of thin-film solar cells: Simulation and experiment," 2015, Physical Review B 92, 075201, 1098-0121/2015/92(7)/075201(9), American Physical Society, pp. 075201-1 to 075201-9 (Year: 2015).

(Continued)

*Primary Examiner* — Darren E Wolf
(74) *Attorney, Agent, or Firm* — Purdue Research Foundation

(57) ABSTRACT

A modulating circuit adapted to modulate between an energy harvesting mode and a wireless transmitter mode is disclosed which includes a solar cell, an energy-harvesting circuit, a first switch coupling the solar cell to the energy harvesting circuit and controlled by a first control line, a second switch coupling the solar cell to a programmable current source and controlled by a second control line, a transmitter/energy harvesting mode circuit adapted to select between a transmitter mode and an energy harvesting mode, and a symbol-to-current mapping circuit adapted to encode data to be communicated by the solar cell, the symbol-to-current mapping circuit adapted to adjust the programmable current source to thereby provide a metered current to the solar cell.

20 Claims, 36 Drawing Sheets

Related U.S. Application Data division of application No. 16/927,967, filed on Jul. 13, 2020, now Pat. No. 11,070,290, which is a continuation of application No. 16/559,558, filed on Sep. 3, 2019, now Pat. No. 10,715,252.

(60) Provisional application No. 62/727,315, filed on Sep. 5, 2018.

(51) Int. Cl.

| | | |
|---|---|---|
| *H02M 3/156* | (2006.01) | |
| *H02S 40/30* | (2014.01) | |
| *H02S 99/00* | (2014.01) | |
| *H04B 10/40* | (2013.01) | |
| *H04B 10/50* | (2013.01) | |
| *H04B 10/516* | (2013.01) | |
| *H04B 10/80* | (2013.01) | |

(56) References Cited

OTHER PUBLICATIONS

Langmann, Fast Photoluminescence Modulation for Optoelectronic Applications, Electronics Letters, Oct. 2, 1975, vol. 11, Issue: 20.

Wang, Z. et al., On the Design of a Solar-Panel Receiver for Optical Wireless Communication With Simultaneous Energy Harvesting, Aug. 2015, IEEE Journal on Selected Areas in Communications, vol. 33, Issue: 8.

Zhang, S. et al., Organic Solar Cells as High-Speed Data Detectors for Visible Light Communication, Jul. 2015, Optica Letter, vol. 2, No. 7, Optica 607-610, 2015, Optical Society of America.

Leon-Salas, W. D. et al., Exploiting Luminescence Emissions of Solar Cells for Optical Frequency Identification (OFID), May 4, 2018, 2018 IEEE International Symposium on Circuits and Systems (ISCAS).

Li, J. et al., Retro-VLC: Enabling Battery-Free Duplex Visible Light Communication for Mobile and Hot Applications, 2015, Computer Science, HotMobile '15, Feb. 12-13, 2015.

Miller, O. et al., Strong Internal and External Luminescence as Solar Cells Approach the Shockley-Queisser Limit, IEEE Journal of Photovoltaics, vol. 2, No. 3, Jul. 2012, 303-311.

Wang, Z. et al., Towards Self-Powered Solar Panel Receiver for Optical Wireless Communication, 2014, IEEE ICC—Optical Networks and Systems.

Sarwar, R. et al., Visible Light Communication Using a Solar-Panel Receiver, 2017, 16th International Conference on Optical Communications and Networks (ICOCN), 978-1-5386-3273-4/17, IEEE, 2017.

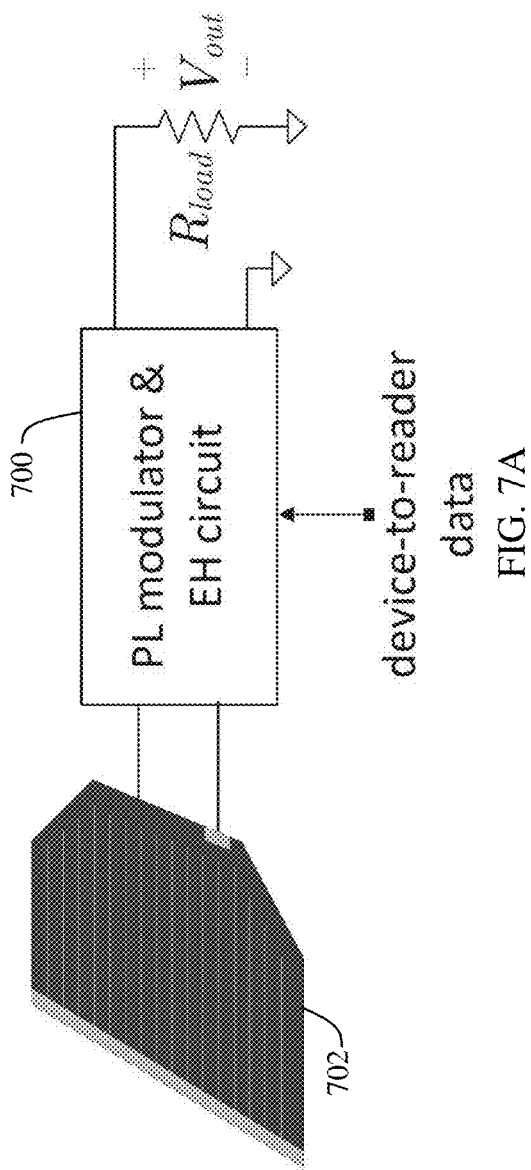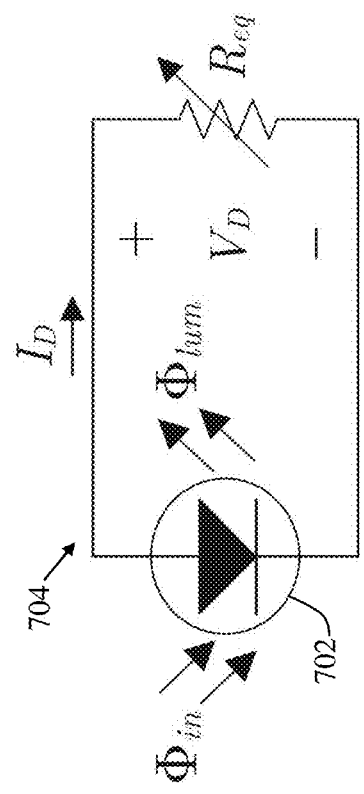
FIG. 7A
FIG. 7B

SYSTEMS AND METHODS FOR LIGHT COLLECTION AND DISTRIBUTION

CROSS-REFERENCE TO RELATED APPLICATIONS

The present patent application is a continuation of U.S. Pat. No. 11,469,818, issued Oct. 11, 2022, which is a division of U.S. Pat. No. 11,070,290, issued Jul. 20, 2021, which is a continuation of U.S. Pat. No. 10,715,252, issued Jul. 14, 2020, which is related to and claims the priority benefit of U.S. Provisional Patent Application No. 62/727,315, filed Sep. 5, 2018, the contents of each of which are hereby incorporated by reference in their entirety into the present disclosure.

STATEMENT REGARDING GOVERNMENT SUPPORT

The present disclosure was not supported by the US government.

TECHNICAL FIELD

The present disclosure generally relates to solar cells, and in particular to the modulation of photo-luminescent and electro-luminescent emissions of said solar cells.

BACKGROUND

This section introduces aspects that may help facilitate a better understanding of the disclosure. Accordingly, these statements are to be read in this light and are not to be understood as admissions about what is or is not prior art.

Many technologies across a plurality of applications (i.e. Internet-of-Things (IoT) applications and devices, manufacturing equipment, shipping technologies, etc.) support some form of wireless communication. One of the most common methods is through the emitting and receiving of radio signals. These technologies use devices that emit radio signals to transmit encoded data which is then read by another device in order to determine what corresponding set of actions or events must take place. One such technology commonly used is Radio Frequency Identification (RFID). However, RFID technology has limitations making it inconvenient to use in certain situations. RFID devices are energized by the radiation emitted by a reader, requiring the RFID device to be in close proximity to the reader.

For this type of communication, radio-based communication has been the dominant technology for establishing wireless connectivity in IoT applications. Most existing solutions rely on unlicensed radio bands for ease of deployment and adoption. However, these bands are expected to become increasingly crowded as more IoT devices are deployed resulting in higher interference levels and slower throughputs.

Furthermore, RFID tags that are mounted on metallic surfaces require special mounting equipment in order to avoid detuning resulting in an increased cost to the end user and requiring a larger area to be used. RFID devices are also very limited in underwater usage. Low-Frequency RFID devices are capable of working underwater, however such RFID devices have a greatly diminished range.

Therefore, there is an unmet need for a novel approach to provide wireless communication of data between two devices without relying on crowded radio-frequency bands.

SUMMARY

A modulating circuit adapted to modulate between an energy harvesting mode and a wireless transmitter mode is disclosed. The circuit includes a solar cell adapted to generate charge from injected electrons onto the solar cell, an energy-harvesting circuit adapted to convey the charge from the solar cell to an energy reservoir, a first switch coupling the solar cell to the energy harvesting circuit and controlled by a first control line, a second switch coupling the solar cell to a programmable current source and controlled by a second control line, a transmitter/energy harvesting mode circuit adapted to select between a transmitter mode and an energy harvesting mode, the transmitter/energy harvesting mode circuit controls the first and the second control lines of the first and second switches to thereby achieve i) the energy harvesting mode, wherein the first control line is activated to thereby close the first switch while deactivating the second control line to deactivate the second switch, and ii) the wireless transmitter mode, wherein the first control line is deactivated to thereby open the first switch while controlling the second control line to activate the second switch, and a symbol-to-current mapping circuit adapted to encode data to be communicated by the solar cell, the symbol-to-current mapping circuit adapted to adjust the programmable current source to thereby provide a metered current to the solar cell.

BRIEF DESCRIPTION OF DRAWINGS

FIG. 7A is a system-level diagram of proof-of-concept circuit for a PL modulator and EH circuit.

FIG. 7B shows the basic PL modulation principle employed in FIG. 7A.

DETAILED DESCRIPTION

Figure 1:
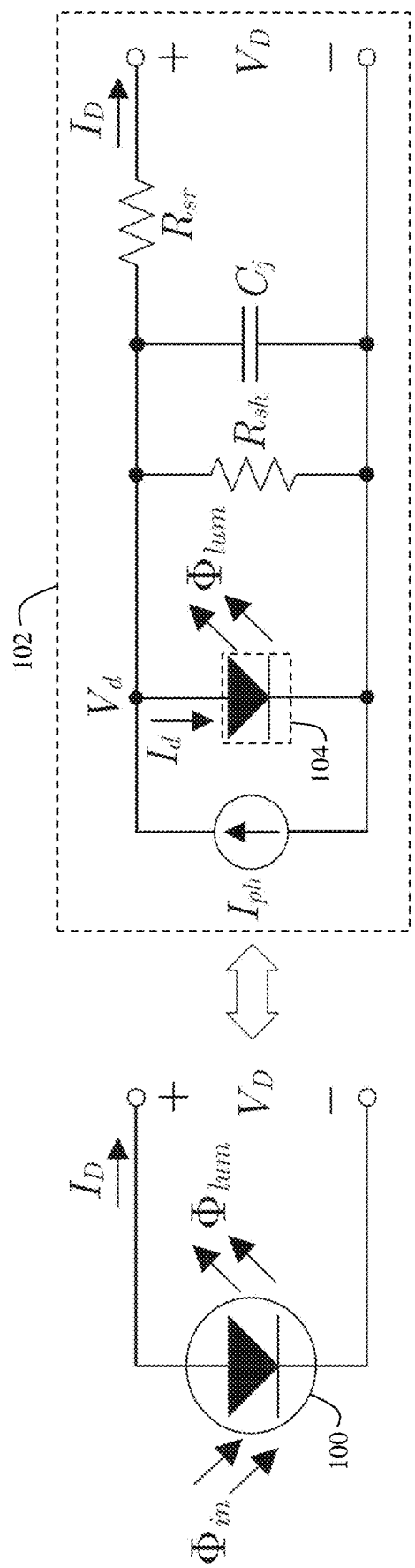
FIG. 1 is a single-diode equivalent circuit of a solar cell including emitted luminescent radiation.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel approach to a wireless optical communication scheme that modulates photo-luminescent (PL) and electro-luminescence (EL) emissions of high-efficiency solar cells to transmit information wirelessly is presented. The wireless transmission of information that the present disclosure is concerned with is made possible by the fact that high-efficiency solar cells are also good emitters of light. The emissions of light, referred to as luminescent emissions, are a function of voltage across the cell and can be modulated in order to transmit information. Devices of this type of communication will be referred to as Optical Frequency Identification (OFID) devices.

Figure 28:
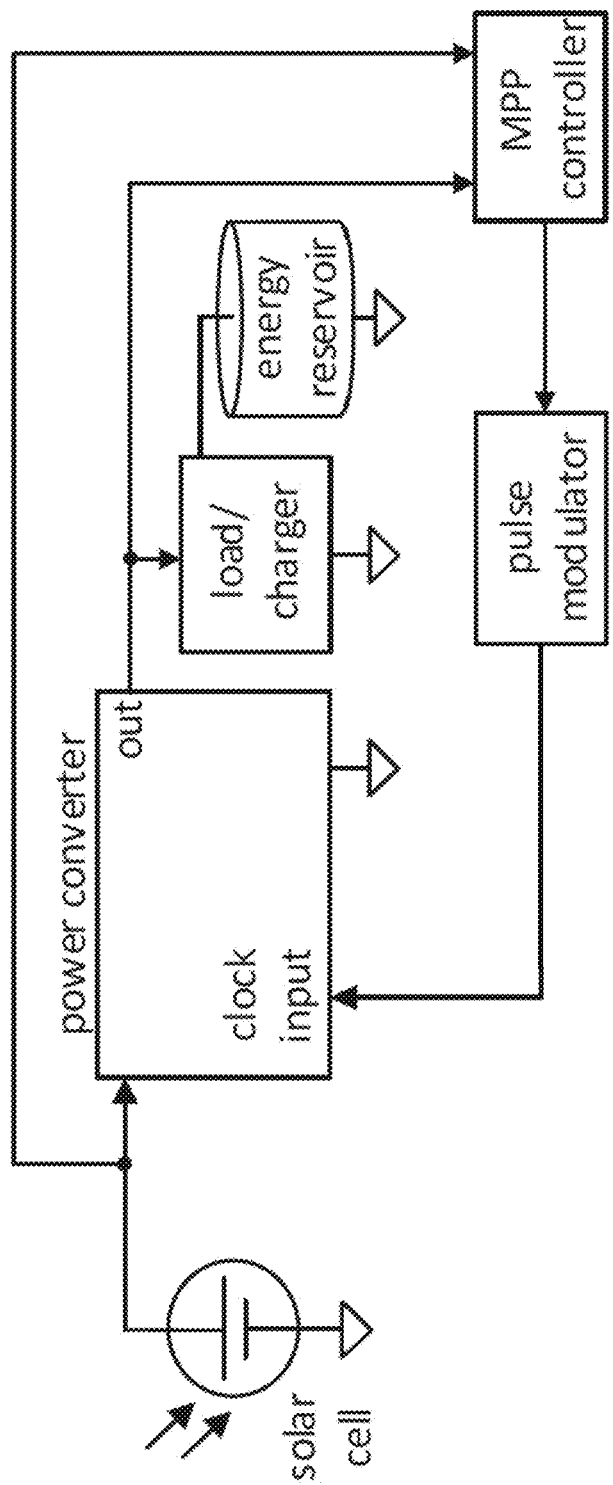
FIG. 28 is a prior art schematic diagram for a solar cell energy harvesting.

Solar cells are adapted to convert incident light to electrical charge that can be stored in a charge reservoir. Referring to FIG. 28, a schematic of a prior art system coupled to a solar cell is shown. The system includes a solar cell which provides charge in minute amounts. The charge is transferred to a boost circuit, shown as the power converter, which is a clocked circuit and is responsible to transfer the minute amounts of charge on a switched basis to the energy reservoir. The input clock to the power converter is modulated based on information from the solar cell and the power converter circuit. The power converter circuit can be a boost DC-DC converter, a buck-boost DC-DC converter, or a buck DC-DC converter, as these types of circuits are known to a person having ordinary skill in the art and the description of the same is thus assumed to be known. In addition, the power converter circuit can be a bi-directional DC-DC converter, that can be used in the EL modality.

Solar cells are advantageously capable of not only harvesting incident energy, but also transmitting and receiving information. As shown in FIG. 28, solar cells are used to convert radiant (light) energy into electrical energy which is typically intended to power some device or store the energy in some form of capacitor or battery. Solar cells are also capable of receiving information which has been encoded optically by virtue of their photo-transduction property. Furthermore, high-efficiency solar cells, are advantageously good emitters of light, which as discussed above are referred to as luminescent emissions. For instance, gallium arsenide (GaAs) solar cells, have strong luminescent emissions in the near infrared portion of the electro-magnetic spectrum. Moreover, the intensity of the luminescent emissions from a solar cell is a function of the cell's voltage.

There are two approaches to cause wireless communication based on luminescent emissions: 1) photo-luminescence (PL) which is directed to luminescence generated by incident light and which can be modulated, or 2) electro-luminescence (EL) which is directed to luminescence generated by electrical energy and which can also be modulated. Thus, in the PL approach, incident light is required to communicate wirelessly. However, in the EL approach, incident light is not required and thus the solar cell can still communicate in complete darkness.

Referring to FIG. 1, a single-diode equivalent circuit 102 of a solar cell 100 is shown. The single-diode equivalent circuit 102 includes emitted luminescent radiation flux $\Phi_{lum}$ measured in Watts, where the incident radiant flux of the solar cell 100 is denoted by $\Phi_{in}$. In the single-diode equivalent circuit 102, the diode modeling the "knee" in the current-vs-voltage (IV) curve of a solar cell, known to a person having ordinary skill in the art, is replaced by a light-emitting diode 104 (LED). Luminescence is the emission of light from certain materials, such as semiconductors, under external excitation, and which is not caused by an increase in temperature. Photo-luminescence (PL) occurs when the external excitation is provided by light, whereas electro-luminescence (EL) occurs when the external excitation is provided by injected electrical charges. In semiconductors where there is a conduction band and a valence band separated by an energy band gap, luminescence occurs when electrons from the conduction band transition to the valence band emitting a photon of energy $E_g$ equal to the electron's excess energy. The energy of a photon can be quantified by $$E_{ph}^e = hc/\lambda_e \quad (1)$$

where h is Planck's constant,
c is the speed of light, and
$\lambda_e$ is the wavelength. By equating equation (1) to the emitted photon energy $E_g$, the wavelength of the emitted photons can be calculated. For instance, gallium arsenide (GaAs) has a band gap energy of 1.4 eV resulting in an emitted wavelength of 886.3 nm.

With further reference to FIG. 1, other parameters are defined as $R_{sh}$ represents the shunt resistance,
$C_j$ represents the junction capacitance,
$R_{sr}$ represents the series resistance of the solar cell 100, and
$I_{ph}$ represents the photo-generated current of the solar cell 100. For monochromatic light, the value of $I_{ph}$ is given by the formula:

$$I_{ph} = Q(1-R)QE(\lambda_i)\left(\frac{\Phi_{in}}{E_{ph}^i}\right) \quad (2)$$

where, $$\left(\frac{\Phi_{in}}{E_{ph}^i}\right)$$

is $\phi_{in}$ which is the incident radiant flux
q is the electron's charge,
R is the fraction of the photo-generated electrons that recombine inside the solar cell 100 and do not contribute to the current,
$QE(\lambda_i)$ is the quantum efficiency at the wavelength of the incident light $\lambda_i$, and
$E_{ph}^i$ is the energy of an incident photon. The current through the LED 104 $I_d$ is related to the implied voltage $V_d$ by the equation:

$$I_d = I_s(e^{V_d/nV_T} - 1) \quad (3)$$

where, n is the ideality factor of the diode,
$V_T$ is the thermal voltage, and $I_s$ is the reverse saturation current. The luminescent radiant flux $\Phi_{lum}$ emitted by the solar cell 100 has two components represented by the equation:

$$\Phi_{lum} = \underbrace{\eta\kappa R QE(\lambda_i)\Phi_{in}}_{\text{first component}} + \underbrace{\eta\kappa R E_{ph}^e\left(\frac{I_d}{q}\right)}_{\text{second component}} \quad (4)$$

where the first component is due to the photo-generated electrons that recombine radiatively and the second component is due to the current $I_d$ that flows through the solar cell 102. In (4), η is the fraction of photons generated inside and escape from the solar cell 100 (i.e. photons that do not get internally reflected or re-absorbed), and κ is the fraction of recombined electrons that recombine radiatively (i.e. generate a photon upon recombination). In situations with no radiant flux ($\Phi_{in}=0$), the emitted luminescent radiant flux is only due to charges injected into the solar cell 100 via electro-luminescence (EL).

For most solar cells 100, $R_{sr}$ is about 0. By combining equations (3) and (4) and assuming $V_d$ is about the same as $V_D$, yields the following equation:

$$\Phi_{lum} = \eta\kappa R\left(QE(\lambda_i)\Phi_{in} - \frac{E_{ph}^e I_s}{q} + \frac{E_{ph}^e I_s e^{V_D/nV_T}}{q}\right) \quad (5)$$

Equation (5) shows an exponential relationship between $\Phi_{lum}$ and the external voltage $V_D$. This relationship is exploited in the present disclosure in order to modulate the luminescent emissions of a solar cell to convey information. Of particular interest is the luminescent radiant flux at short circuit (SC) $\Phi_{lum}^{sc}$, open circuit (OC) $\Phi_{lum}^{oc}$ and at the maximum power point (MPP) $\Phi_{lum}^{mpp}$. From equation (5) one can obtain the following three equations:

$$\Phi_{lum}^{sc} = \eta\kappa R(QE \cdot \Phi_{in}) \quad (6)$$

$$\Phi_{lum}^{oc} = \eta\kappa R(QE \cdot \Phi_{in}) - \frac{E_{ph}^e I_s}{q} + \frac{E_{ph}^e I_s e^{V_{oc}/nV_T}}{q} \quad (7)$$

$$\Phi_{lum}^{mpp} = \eta\kappa R(QE \cdot \Phi_{in}) - \frac{E_{ph}^e I_s}{q} + \frac{E_{ph}^e I_s e^{V_{mpp}/nV_T}}{q} \quad (8)$$

where $V_{oc}$ is the solar cell's 100 open circuit voltage and $V_{mpp}$ is the solar cell's 100 voltage at the maximum power point. Furthermore, considering a large $R_{sh}$, the following explicit solutions for $V_{oc}$ and $V_{mpp}$ can be obtained:

$$V_{oc} = nV_T \log\left(\frac{I_{ph} + I_s}{I_s}\right) \quad (9)$$

$$V_{mpp} = nV_T \cdot W\left(\frac{I_{ph} + I_s}{I_s} \cdot e\right) - nV_T \quad (10)$$

where, W(•) is the Lamber-W function.

Figure 2:
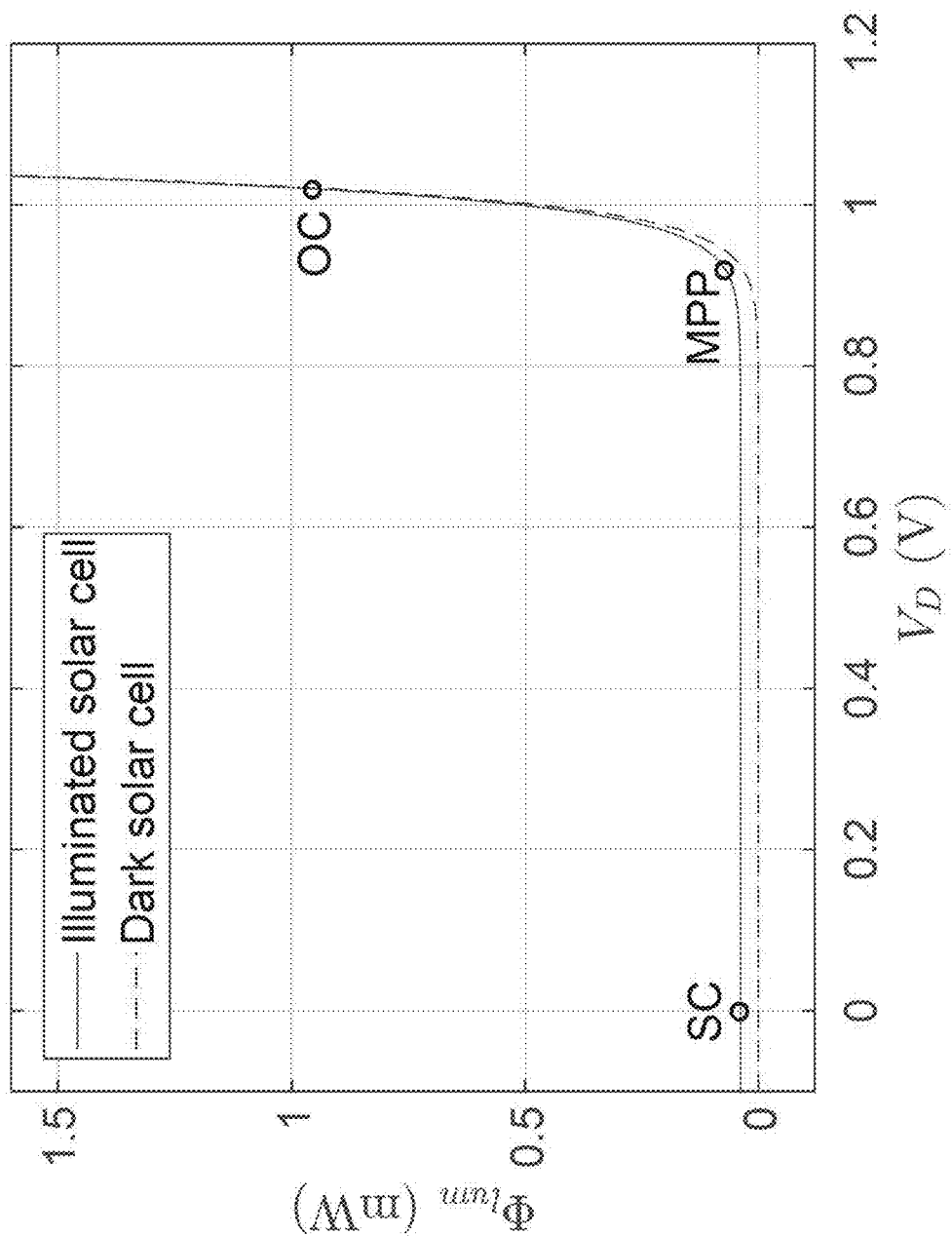
FIG. 2 is a graphical representation of the relationship between the luminescent radiant flux emitted by a solar cell and the voltage across the solar cell.

With reference to FIG. 2, a graphical representation of the relationship between the luminescent radiant flux $\Phi_{lum}$ and external voltage $V_D$ as described by equation (5) for η=0.4, κ=0.8, R=0.1, QE=0.8, $I_s$=3.506×10$^{-17}$ A, and $\Phi_{in}$=1.5 mW is presented. Values for luminescent radiant flux at short circuit (SC) $\Phi_{lum}^{sc}$, open circuit (OC) $\Phi_{lum}^{oc}$ and at the maximum power point (MPP) $\Phi_{lum}^{mpp}$ are marked by circles on the figure and are given by the appropriate combination of equations (6), (7), (8) and equations (9), and (10). For instance, if one were to obtain the open circuit luminescent radiant flux, a combination of equations (7) and (9) would be used. For cases where the external voltage $V_D$ is greater than the open circuit voltage $V_{oc}$ ($V_D > V_{oc}$), the net current flow is into the solar cell 102. Hence, for the case where $V_D > V_{oc}$, the excitation that stimulates luminescence includes injected charges. In this scenario the solar cell 102 consumes energy instead of generating energy. However, high levels of luminescent radiant flux can be achieved for $V_D > V_{oc}$. The region $V_D < V_{oc}$ corresponds to photo-luminescence (PL). In this region, the luminescent radiant flux $\Phi_{lum}$ can be modulated using different strategies. For example, the cell can be switched between OC and MPP or OC and SC for On-Off Keying (OOK) modulation. In the OC state, the PL is at its maximum, while at SC, PL is at its minimum, and further at MPP, the luminescence is in between. The discrimination between the three luminescence levels allows binary and ternary digital communication modulation schemes. Between these three states, at the maximum power point (MPP) the solar cell 102 provides the maximum amount of energy. Therefore, a modulation scheme that includes the MPP may be preferable in terms of energy harvesting. Pulse Amplitude Modulation (PAM) and analog modulation of the PL radiant flux is also possible by operating the solar cell 102 in the region between OC and MPP or between OC and SC.

Figure 3:
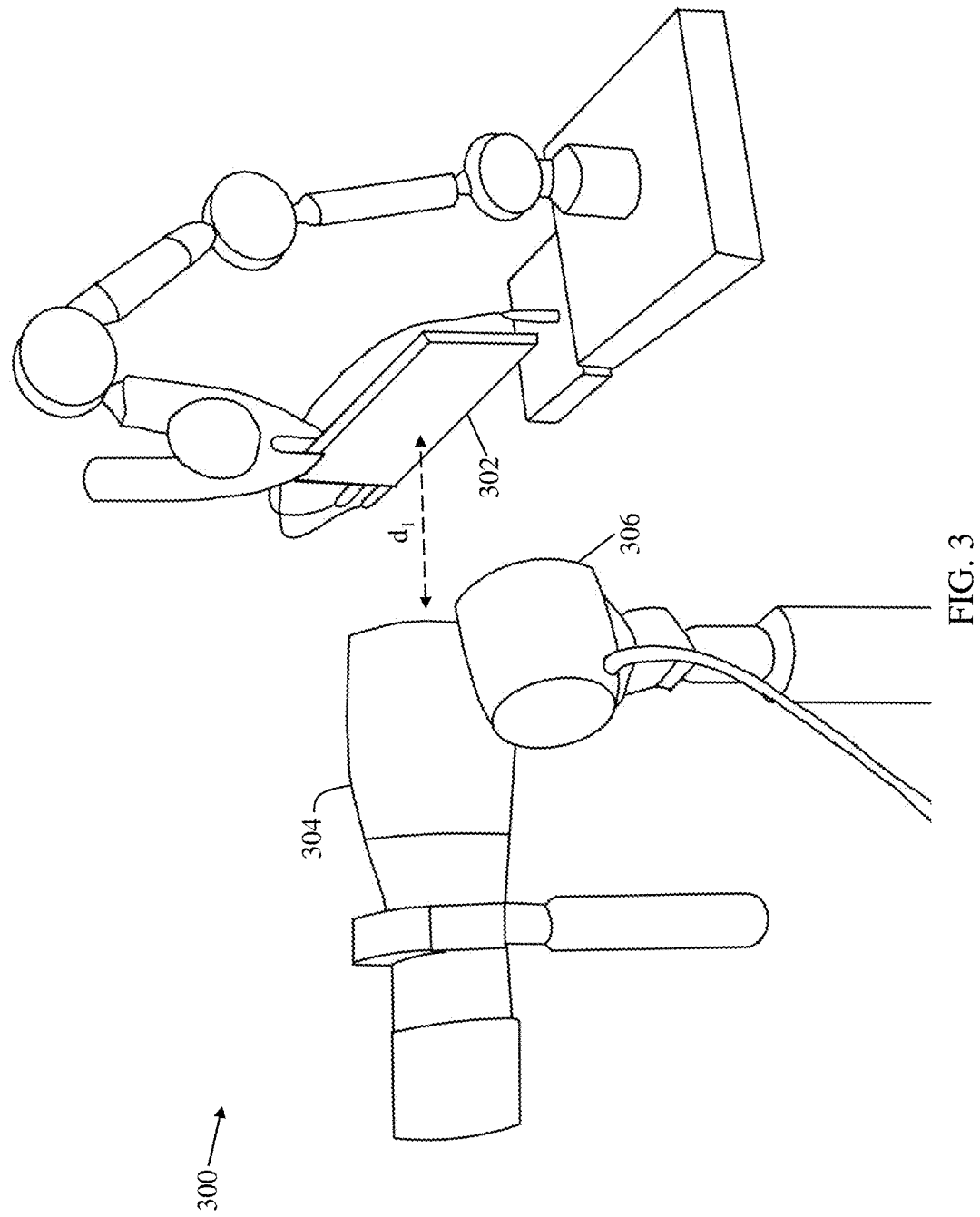
FIG. 3 is a depiction of an experimental setup used to verify the relationship depicted in FIG. 2.

The exponential relationship between $\Phi_{lum}$ and $V_D$ was verified experimentally using the setup shown in FIG. 3. In this first experimental setup 300, a GaAs solar cell 302 was placed at a distance di equal to about 6.5 centimeters in front of a red LED flashlight 304 with emitted irradiance of 23.98 mW/cm². It should be known that, as discussed above, GaAs solar cells 302 have strong luminescent emissions in the near infrared portion of the electro-magnetic spectrum. An optical power sensor 306, with an 850 nm long-pass optical filter in front of it, not shown in the figure, was placed at the same distance di from the GaAs solar cell 302. Radiant flux emitted by the GaAs solar cell 302 was then recorded. The first experimental setup 300 was isolated from incident light in order to avoid unintended excitations.

Figure 4:
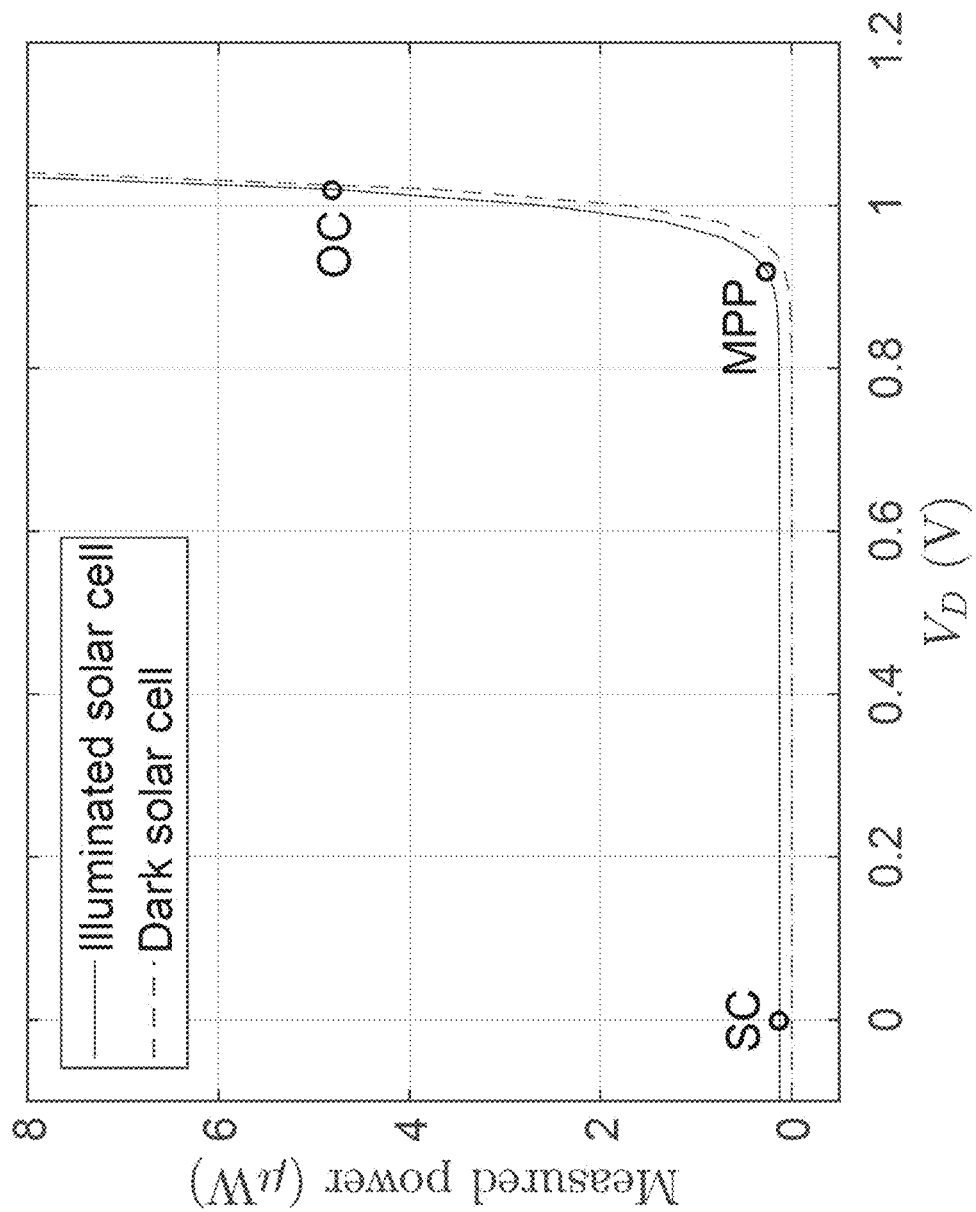
FIG. 4 is a graphical representation of the measured relationship between the luminescent radiant flux emitted by the solar cell of FIG. 3 and voltage across the solar cell.

With reference to FIG. 4, a graph comparing the measured power of the GaAs solar cell 302 from the first experimental setup 300 is shown. The graph compares two scenarios, one where the GaAs solar cell 302 was illuminated by the LED flashlight 304 and one where the GaAs solar cell 302 was dark, meaning that the LED flashlight 304 was not on. From FIG. 4 it can be seen that the exponential relationship between $\Phi_{lum}$ and $V_D$ given by equation (5) was observed. Visual confirmation of PL and EL emissions were obtained using a night-vision camera sensitive to infrared light. Four different scenarios were tested for confirmation. The first scenario included the GaAs solar cell 302 illuminated by the LED flashlight 304 and with an open circuit between the GaAs solar cell 302 terminals (OC PL). In this scenario the night-vision camera picked up the infrared light emitted by the GaAs solar cell 302. The second scenario included the GaAs solar cell 302 illuminated by the LED flashlight 304 while the GaAs solar cell 302 was biased at the MPP (MPP PL). In this scenario the night-vision camera picked up diminished infrared light. The third scenario included the GaAs solar cell 302 illuminated by the LED flashlight 304 with a short circuit between the GaAs solar cell's 302 terminals (SC PL). In this scenario the night-vision camera picked diminished infrared light. The fourth scenario included the GaAs solar cell 302 while the LED flashlight 304 was turned off and an external voltage of 1.0 V was applied to the GaAs solar cell 302 (EL). In this scenario the night-vision camera picked up the EL emission given off by the GaAs solar cell 302.

It can be observed that there is a significant difference between the luminescent radiation emitted by the solar cell at OC and at MPP or SC. This observation qualitatively confirms the model and measurements previously discussed. A strong EL emission can also be observed suggesting that even in a complete dark environment, the GaAs solar cell 302 can still be employed to transmit information.

In particular, it can be seen from the graph of FIG. 4 that the short circuit (SC) produces 0.12 µW when the voltage across solar cell is 0 V. Conversely, the MPP mode produces 0.25 µW when the voltage across solar cell is 0.92 V. Further in comparison with open circuit, the open circuit (OC) produces 4.8 µW when the voltage across solar cell is 1.2 V.

Figure 5:
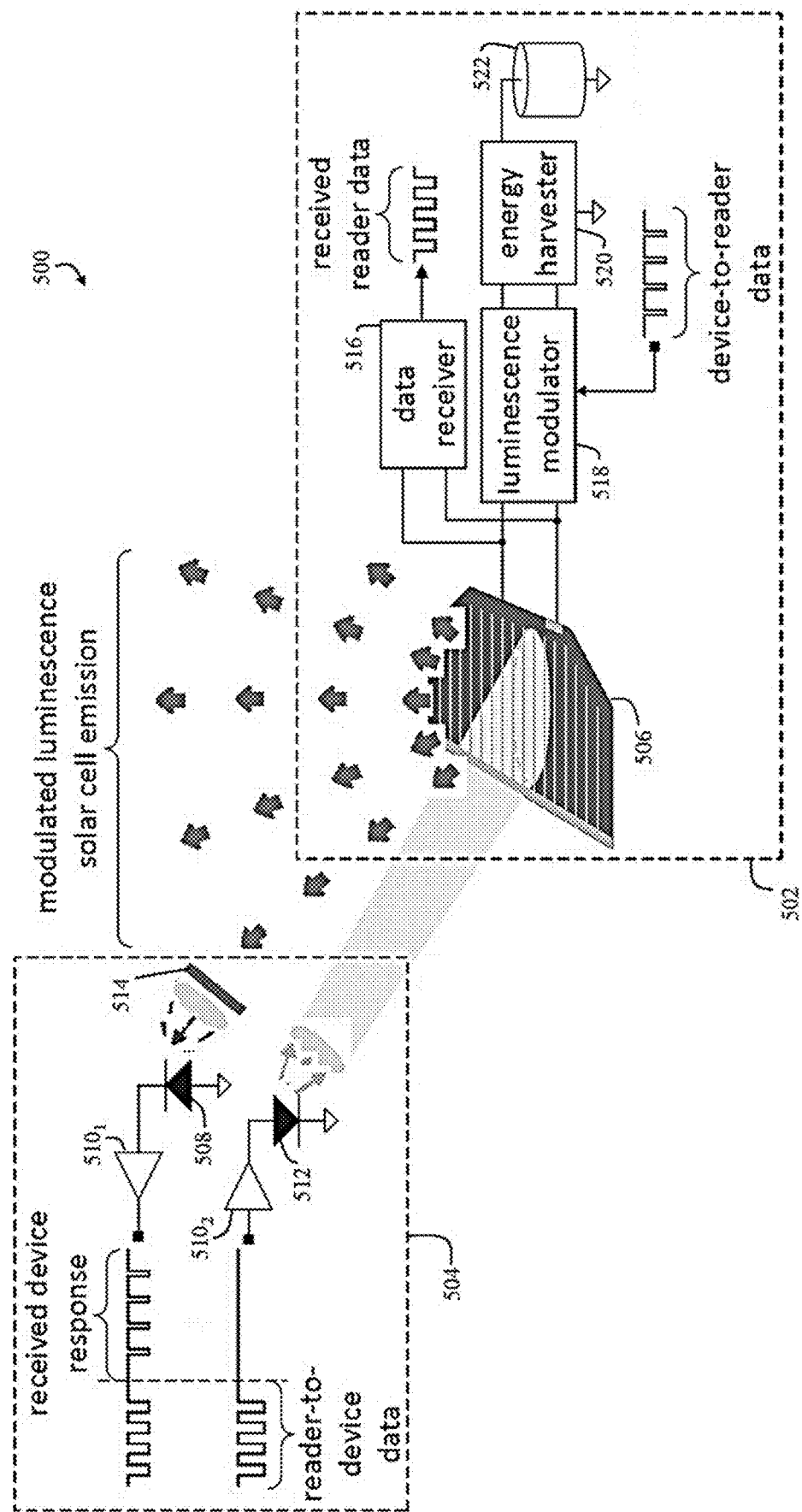
FIG. 5 is a conceptual diagram of an embodiment of an OFID communication system having an active reader.

Referring to FIG. 5 a conceptual embodiment of an OFID communication system 500 is shown. Communication is between an OFID device 502 and a reader 504. The reader 504 shown in FIG. 5 is an active reader, that is, a reader 504 that illuminates the solar cell 506 in the OFID device 502. The light generated by the reader 504 carries radiant energy from the reader 504 to the OFID device 502 to energize and activate the OFID device 502. To transmit data to the OFID device 502, the reader 502 modulates the power of the generated light. The reader 504 is also equipped with a photo-detector 508, amplifiers 5101 and 5102, focusing optics 512 and an optical filter 514 to detect the luminescent radiation emitted by the solar cell 506. The main components of the OFID device are: a data receiver 516 whose function is to demodulate variations in optical power to recover data sent by the reader 504; a luminescence modulator 518 which modulates the luminescent emissions (PL or EL) of the solar cell 506 to transmit data back to the reader 504 and an energy harvester circuit 520 whose function is to draw out energy from the solar cell 506 to either power up the OFID device 502 directly or to charge an energy reservoir 522.

The energy harvester 520 may also boost and stabilize the output voltage of the solar cell 506 in order to provide a supply voltage suitable to power the electronic circuits in the OFID device 502. The energy reservoir 522, which can be a battery, a capacitor, or a super-capacitor is optional and would be necessary if the OFID device 502 is expected to work when an active reader is not present, there is insufficient electrical current generated from the solar cell 506, or there is none or insufficient incident light to power the OFID device 502. Depending on the target application, an OFID device 502 may be outfitted with a sensor interface, a processor, a timer or a serial communications port.

Figure 6:
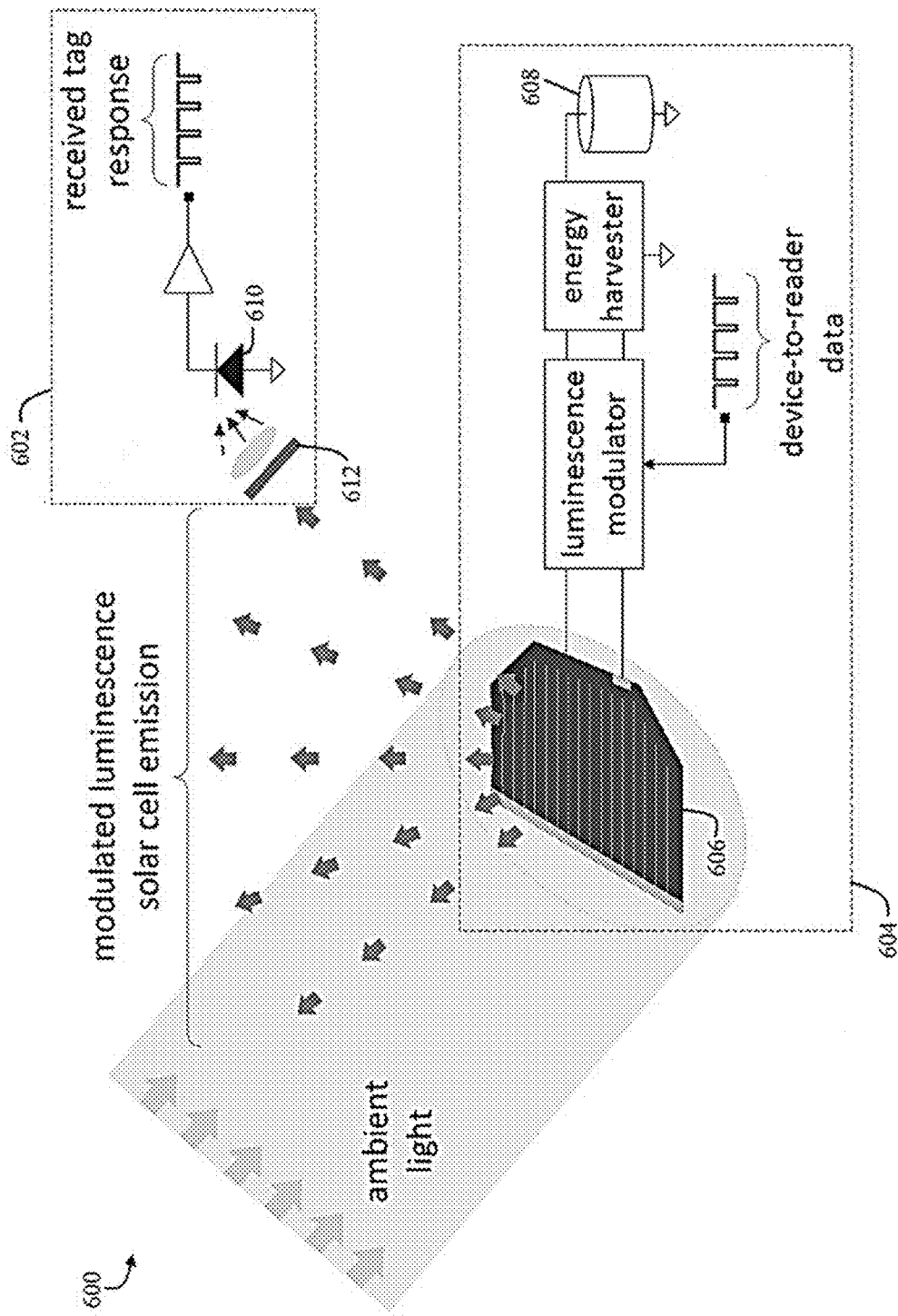
FIG. 6 is a conceptual diagram of an embodiment of an OFID communication system having a passive reader.

Referring to FIG. 6, another embodiment of an OFID communication system 600 is shown. In this embodiment, a passive reader 602 is used instead of the active reader 504 used in the previous embodiment. The passive reader 602 does not actively illuminate the solar cell 606 of the OFID device 604. Instead, the OFID device 604 relies on incident light (shown as ambient light but it could be light generated from a reader) to stimulate PL emissions from the solar cell 606 or to charge the energy reservoir 608 of the OFID device 604. This embodiment has the advantage of simplifying the reader 602 complexity, which only needs to be equipped with a photo-detector 610 and the corresponding optics, such as an optical filter 612 and a lens.

The embodiment shown in FIG. 6 would be particularly suited for outdoor settings with direct solar radiation. A drawback of this embodiment of an OFID communication system 600 is that the passive reader 602 is not able to transmit data to the corresponding OFID devices 604. Hence, the passive reader 602 cannot interrogate OFID devices 604 or synchronize their transmissions. In these cases, the OFID devices 604 may initiate a transmission based on events, such as a sensor input crossing a threshold or the expiration of a timer. It should also be known, that in dark or not well-lit environments, the OFID device 604 of the present embodiment can still transmit information to the passive reader 602 by stimulating EL emissions from the corresponding solar cell 606.

Referring to FIGS. 7A, a schematic of system-level diagram of the interface between a photo-luminescent (PL) modulator and energy harvester (EH) circuit 700, a solar cell 702 and a load ($R_{load}$). The circuit 700 can both modulate PL emissions from the solar cell 702 and harvest energy while boosting the voltage generated by said solar cell 702. The device-to-reader input is a bit stream with data to be transmitted to a reader (not shown). FIG. 7B shows a possible PL modulation circuit 704 diagram for the basic PL modulation principle of the circuit 700. The PL modulator and EH circuit 700 modulates PL emissions by varying the value of a resistance ($R_{eq}$) connected to the solar cell 702. Varying $R_{eq}$ varies $V_D$ and consequentially $\Phi_{lum}$. Variations in $R_{eq}$ are made according to the transmitted data. From the PL modulation circuit 704 the following equation can be obtained:

$$I_{ph} + I_s = I_s e^{V_D(R_{sr}+R_{eq})/(nV_T R_{eq})} + \left(\frac{R_{sr} + R_{eq} + R_{sh}}{R_{eq}R_{sh}}\right)V_D \quad (11)$$

Figure 7C:
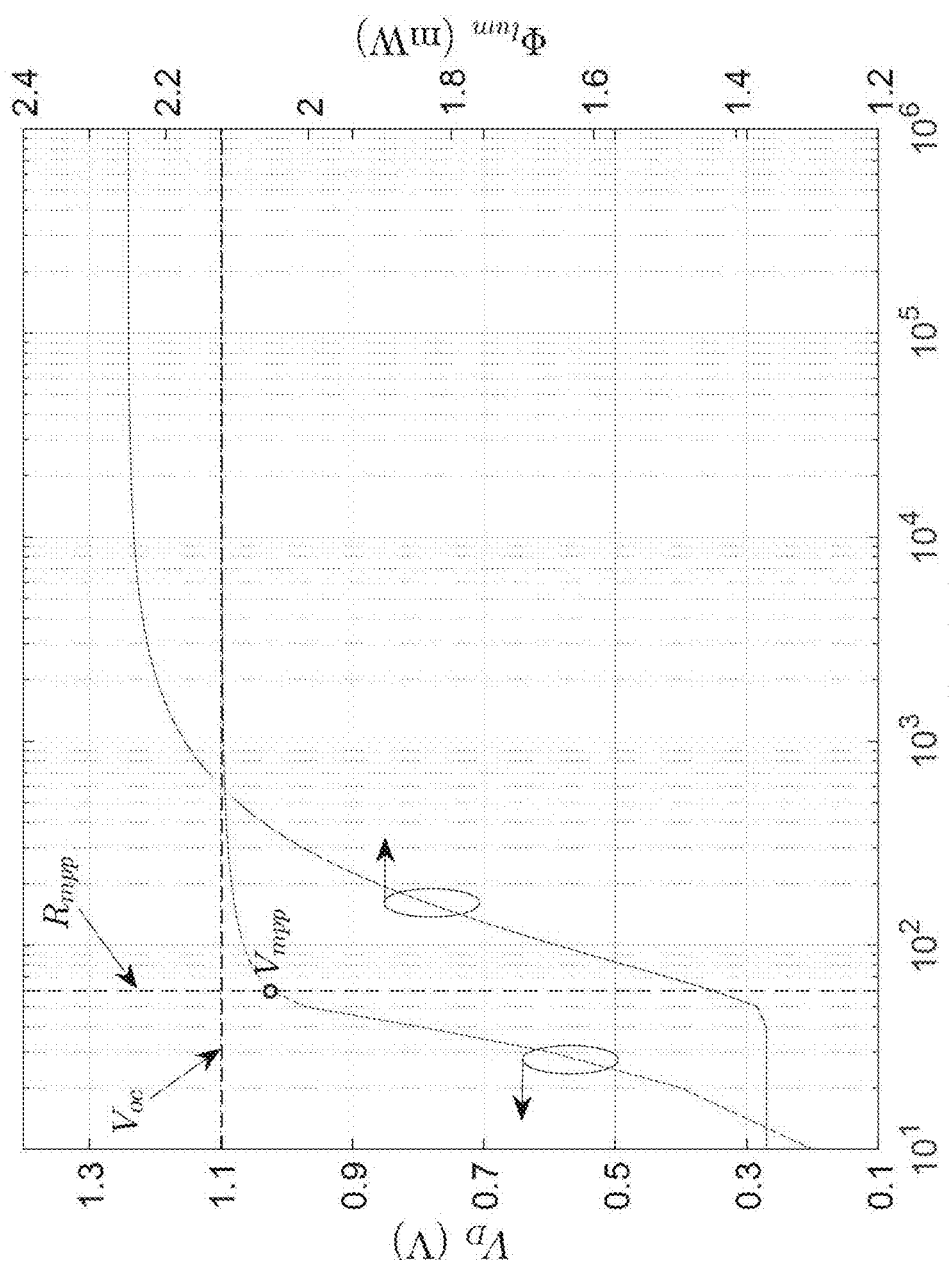
FIG. 7C is a plot of the expected voltage across the solar cell of FIG. 7A and the PL radiant flux as a function of resistance.

FIG. 7C is a graphical representation of the solution for equation (11), where $I_{ph}=20$ mA, along with the relationship between $V_D$ and $R_{eq}$. In FIG. 7C, the conditions $V_D=V_{oc}$ and $R_{eq}=R_{mpp}$, where $$R_{mpp} = \frac{V_{mpp}}{I_{mpp}}$$

is the impedance of the solar cell at the MPP and are highlighted. To gain this result, the following explicit expression for $I_{mpp}$ was employed:

$$I_{mpp} = I_{ph} + I_s - \frac{e(I_{ph}+I_s)}{W\left(\frac{e(I_{ph}+I_s)}{I_s}\right)} \quad (12)$$

From FIG. 7C it can be seen that there is a rapid increase in $\Phi_{lum}$ for $R_{eq}>R_{mpp}$ with $\Phi_{lum}$ reaching 99.5% of its maximum OC value at $R_{eq}=10^4\Omega$. Based on that result, OOK modulation can be accomplished as follows: to transmit a logic high, set $R_{eq}=R_{mpp}$ and to transmit a logic low, set $R_{eq}>10^4\Omega$. Since $R_{eq}=R_{mpp}$ results in the maximum amount of energy draw from the solar cell 702, when data is not being transmitted, $R_{eq}$ should be set to $R_{mpp}$. PAM can be accomplished by varying $R_{eq}$ in discrete steps in the range between $R_{mpp}$ and $10^4\Omega$.

Figure 8:
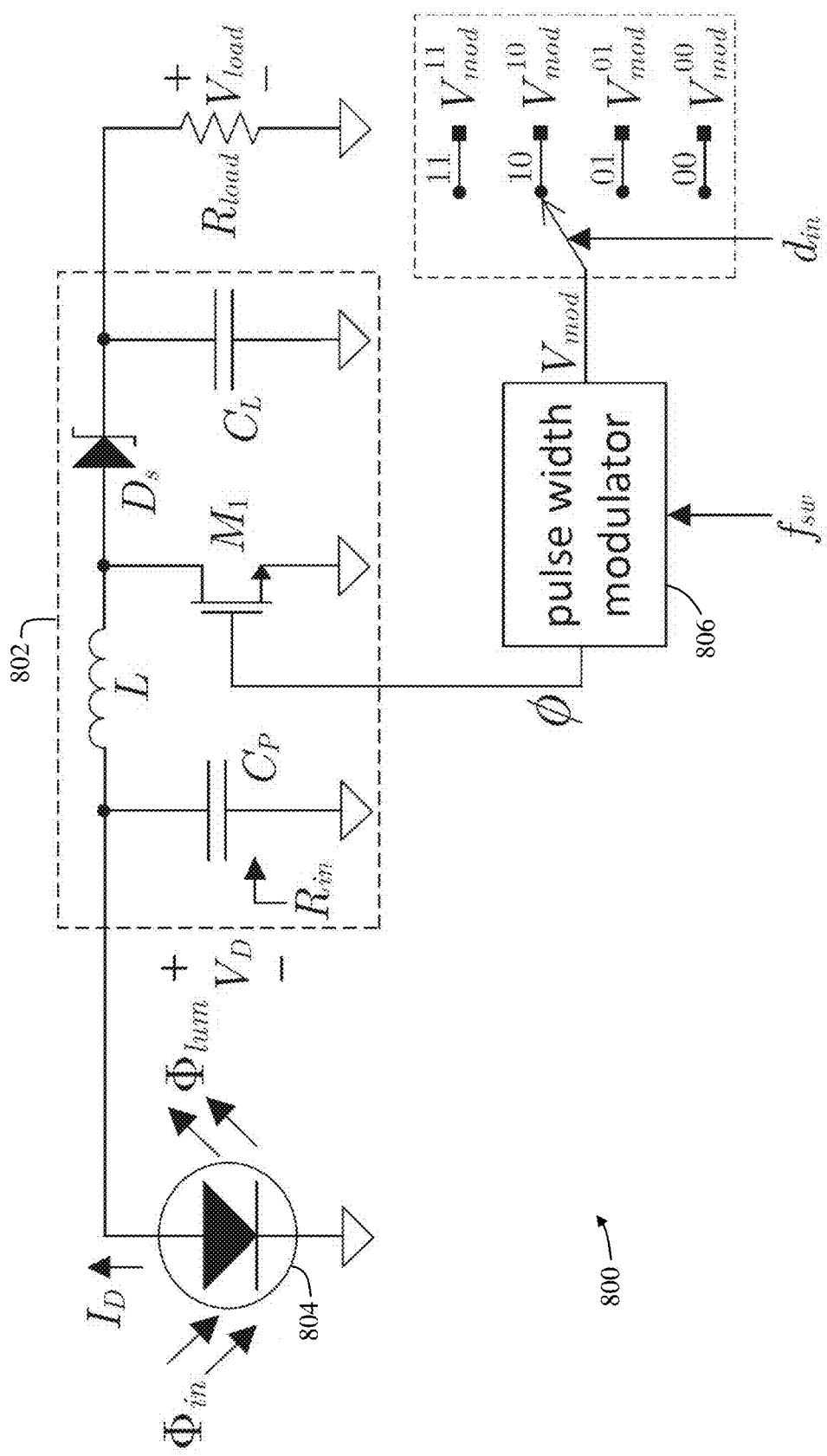
FIG. 8 is a schematic diagram of an embodiment of a proposed PL modulator and EH circuit.

Referring to FIG. 8, a schematic diagram of an implementation of a PL modulator and EH circuit 800 is shown. The PL modulator and EH circuit 800 is based on one of the power conversion schemes discussed above; in this case a boost DC-DC converter 802. Transistor (e.g., Metal Oxide Field Effect Transistor (MOSFET)) $M_1$ works as a switch and is driven by clock signal $\phi$ of frequency $f_{sw}$ and duty cycle $\rho$. The circuit 800 works in two phases: Phase 1 when $\phi$ is logic high and Phase 2 when $\phi$ is logic low. During Phase 1, $M_1$ closes connecting inductor L in parallel with the solar cell 804, charging inductor L. In Phase 2, $M_1$ opens and the inductor discharges through the Schottky diode $D_s$ into the load $R_{load}$. During Phase 1 capacitor $C_L$ feeds the load. The pulse width modulator 806 generates a clock signal with duty cycle proportional at its input $V_{mod}$. The data being transmitted is encoded by the digital signal din, which in this figure, is shown controlling $V_{mod}$ and, therefore, the duty cycle of the boost DC-DC converter 802. The input impedance $R_{in}$ of the DC-DC converter 802 is a function of the duty cycle $\rho$. The duty cycle plays an important role in the operation of the DC-DC converter 802. The proper value of the duty cycle enables the maximum energy transfer from the solar cell 804 to the load.

Figure 9A:
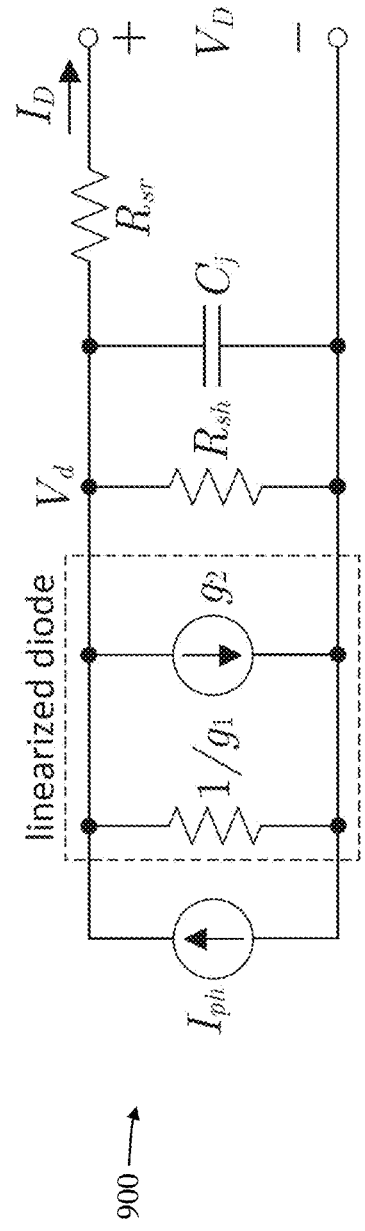
FIGS. 9A-9D are various circuit diagrams used to provide solutions for variables of the proposed PL modulator and EH circuit shown in FIG. 8.
Figure 9B:
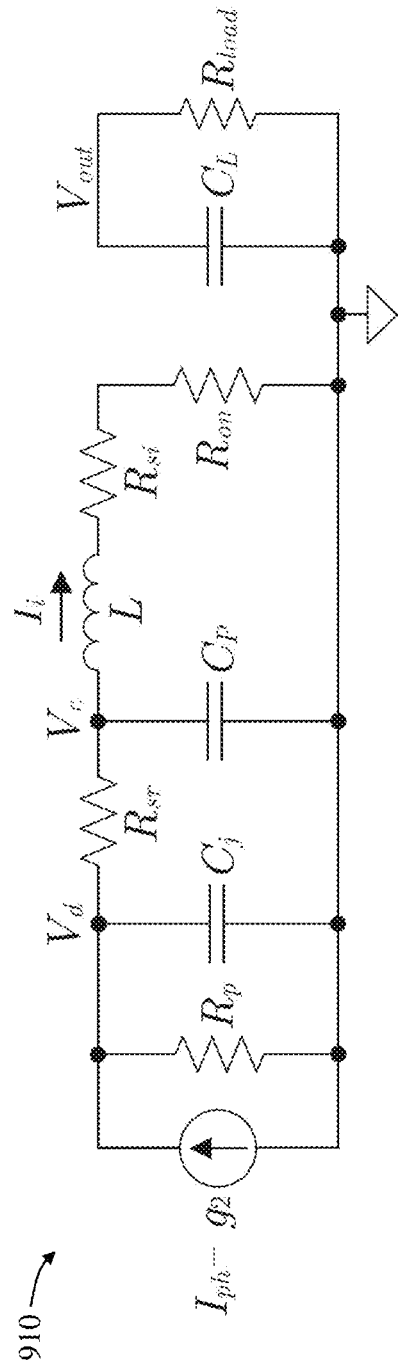

In order to analyze the proposed PL modulator and EH circuit 800 shown in FIG. 8, equivalent linearized circuits at various phases and conditions were analyzed and are shown in FIGS. 9A-9D. FIG. 9A is a linearized solar cell equivalent circuit 900 where the diode in the solar cell equivalent circuit 102 of FIG. 1 was linearized using the first two Taylor series terms of its current-vs-voltage curve. Variables $g_1$ and $g_2$ are equal to:

$$g_1 = \frac{I_s}{nV_T}e^{V_{dm}/nV_T} \quad (12)$$

$$g_2 = I_s\left(e^{\frac{V_{dm}}{nV_T}} - 1\right) - \frac{V_{dm}I_s}{nV_T}e^{\frac{V_{dm}}{nV_T}} \quad (13)$$

and $V_{dm}$ is the solar cell's DC operating point. By replacing the solar cell 804 of the proposed PL modulator and EH circuit 800 of FIG. 8 with the linearized equivalent 900 for Phase 1 ($\phi$=high) yields the equivalent circuit 910 shown in FIG. 9B. In this figure, $R_P=R_{sh}//(1/g_1)$, $R_{si}$ is the series resistance of the inductor and $R_{on}$ is the on resistance of $M_1$. By analyzing the equivalent circuit 910 the following set of differential equations are obtained:

$$\frac{dV_d}{dt} = -\frac{1}{C_j}\left(\frac{1}{R_p} + \frac{1}{R_{sr}}\right)V_d + \frac{1}{C_jR_{sr}}V_c + \frac{I_{ph} - g_2}{C_j} \quad (14)$$

$$\frac{dV_c}{dt} = \frac{1}{C_pR_{sr}}V_d - \frac{1}{C_pR_{sr}}V_c - \frac{1}{C_p}I_i \quad (15)$$

$$\frac{dI_i}{dt} = -\frac{1}{L}V_c - \frac{R_{si}+R_{on}}{L}I_i \quad (16)$$

$$\frac{dV_{out}}{dt} = -\frac{1}{R_{load}C_L}V_{out} \quad (17)$$

Figure 9C:
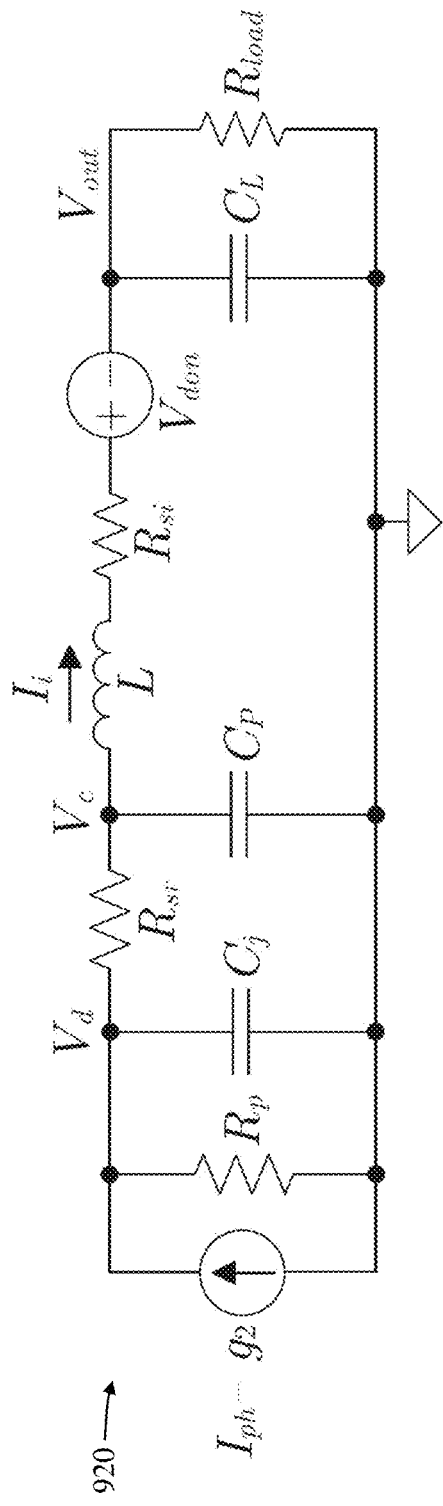

For Phase 2, it is important to consider two different modes: Continuous Current Mode (CCM) and Discontinuous Current Mode (DCM), In CCM, the inductor L doesn't become fully discharged during Phase 2, i.e. the current through the inductor, $I_i$, remains greater than zero. FIG. 9C shows the equivalent circuit 920 during Phase 2 for CCM. $V_{don}$ models the voltage drop across the Schottky diode. By analyzing the equivalent circuit 920 the following set of differential equations are obtained:

$$\frac{dV_d}{dt} = -\frac{1}{C_j}\left(\frac{1}{R_p} + \frac{1}{R_{sr}}\right)V_d + \frac{1}{C_jR_{sr}}V_c + \frac{I_{ph} - g_2}{C_j} \quad (18)$$

$$\frac{dV_c}{dt} = \frac{1}{C_jR_{sr}}V_d - \frac{1}{C_pR_{sr}}V_c - \frac{1}{C_p}I_i \quad (19)$$

$$\frac{dI_i}{dt} = -\frac{1}{L}V_c - \frac{1}{L}V_{out} - \frac{V_{don}}{L} - R_{si}I_i \quad (20)$$

$$\frac{dV_{out}}{dt} = \frac{1}{C_L}I_i - \frac{1}{R_{load}C_L}V_{out} \quad (21)$$

Figure 9D:
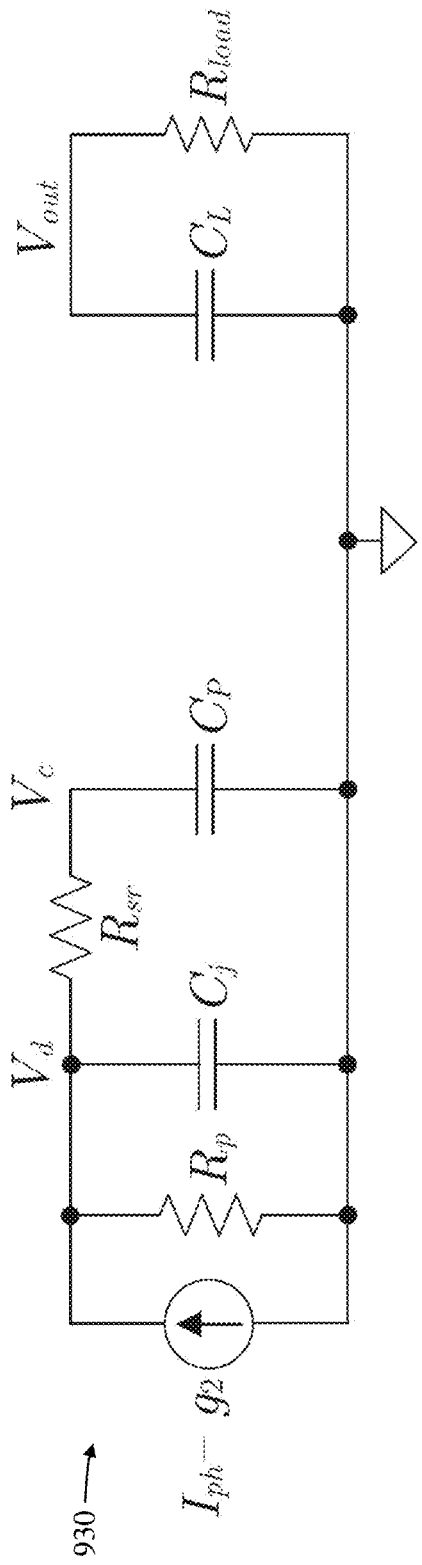

FIG. 9D shows the equivalent circuit 930 during Phase 2 for DCM. In DCM, the inductor gets fully discharged at some point during Phase 2. When that happens, the diode $D_s$ stops conducting, causing the load to become isolated from the rest of the circuit and prevent $C_L$ from discharging through the inductor. By analyzing the equivalent circuit 930 the following set of differential equations are obtained:

$$\frac{dV_d}{dt} = -\frac{1}{C_j}\left(\frac{1}{R_p} + \frac{1}{R_{sr}}\right)V_d + \frac{1}{C_jR_{sr}}V_c + \frac{I_{ph} - g_2}{C_j} \quad (22)$$

-continued $$\frac{dV_c}{dt} = \frac{1}{C_p R_{sr}} V_d - \frac{1}{C_p R_{sr}} V_c \quad (23)$$

$$\frac{dV_{out}}{dt} = -\frac{1}{R_{load} C_L} V_{out} \quad (24)$$

Figure 9E:
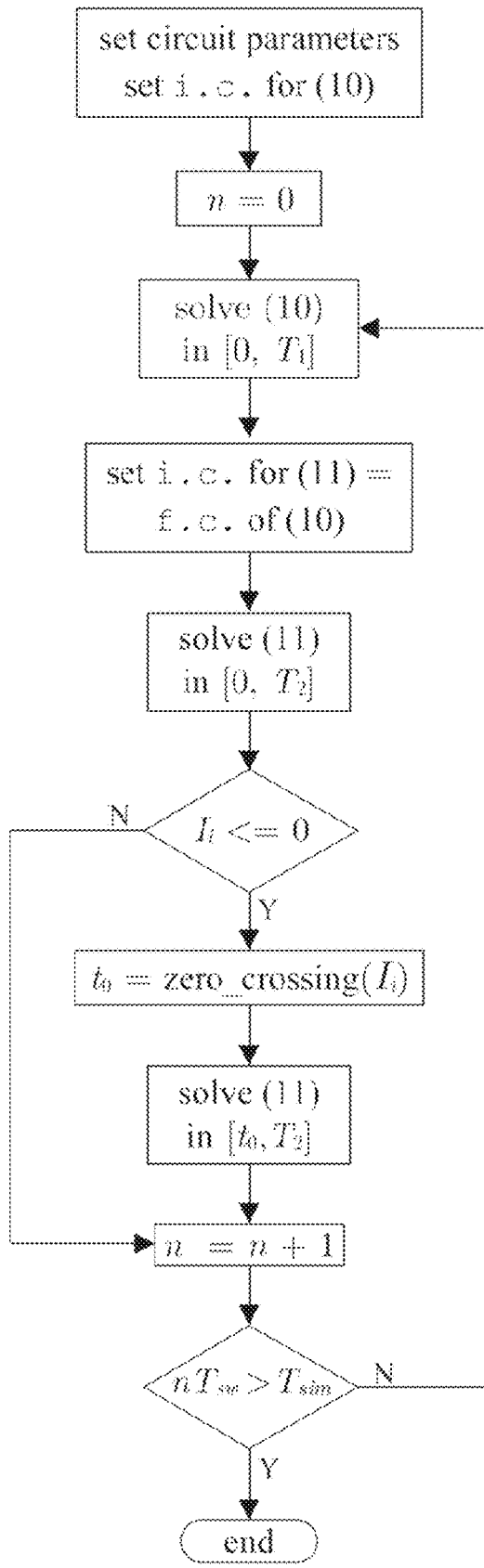
FIG. 9E is a flow chart showing a process to provide solution for variables of the proposed PL modulator and EH circuit shown in FIG. 8.
Figure 9F:
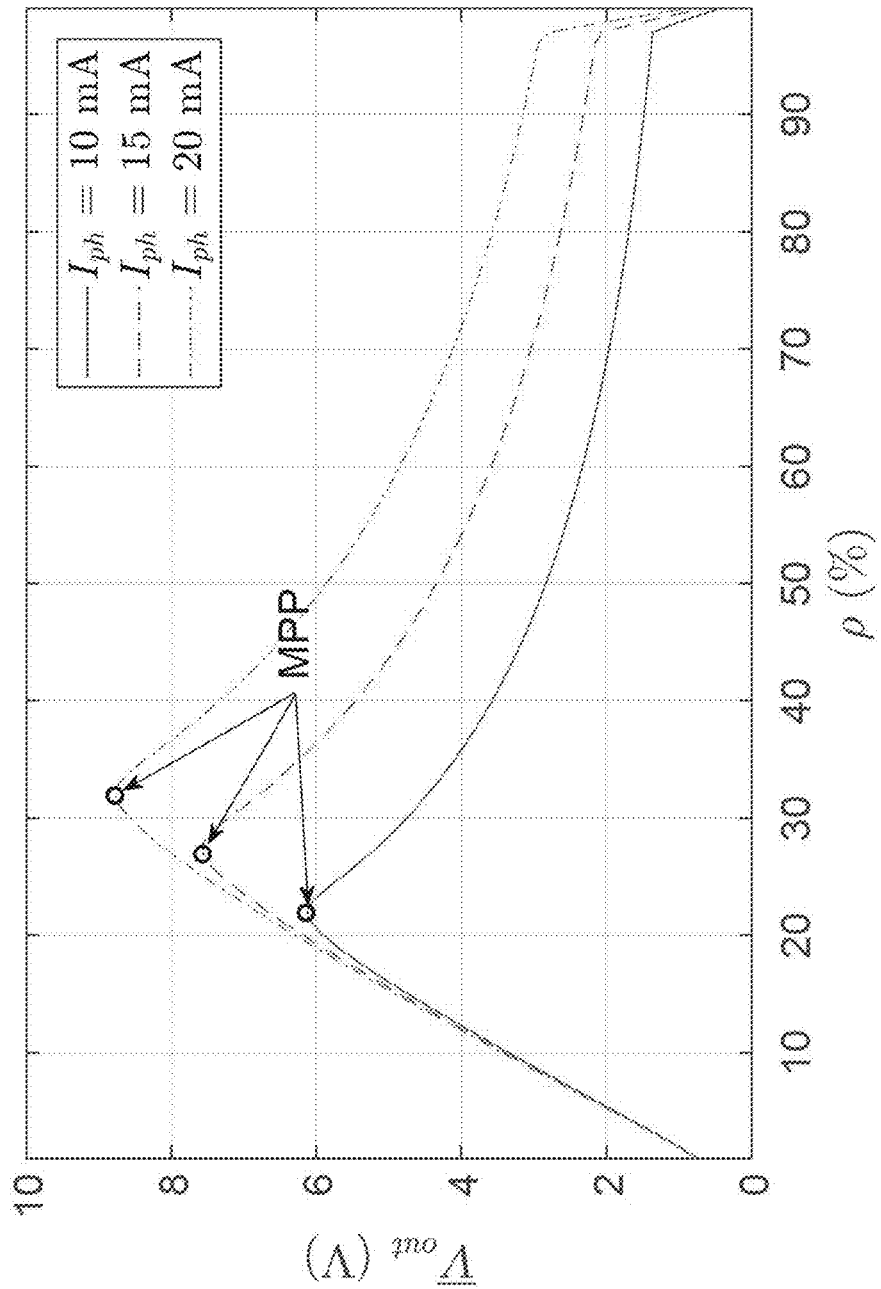
FIG. 9F is a plot of the average output voltage of a DC-DC converter employed in FIG. 8 as a function of duty cycle.

During analysis, equations (14) to (24) were solved numerically using the Runge-Kutta method implemented by computer software, specifically MATLAB®, however other software and methods known to one having ordinary skill in the art may also be used. The equations were solved following the iterative process shown in FIG. 9E. In FIG. 9E:
  "i.c." stand for initial conditions,
  "f.c." stands for final conditions,
  $T_{sw}=1/f_{sw}$,
  $T_1=\rho T_{sw}$,
  $T_2=(1-\rho)T_{sw}$, and
  $T_{sim}$ is the simulation time. Using the iterative process shown in FIG. 9E, the equations (14-24) describing the DC-DC converter 802 (shown in FIG. 8) were solved for three different values of $I_{ph}$ (10, 15 and 20 mA) and for L=68 µH, $R_{si}$=1.0Ω, $C_p$=10 µF, $R_{on}$=0.3Ω, $f_{clk}$=40 kHz, $V_{don}$=0.3 V, $R_{sr}$=1Ω, $C_f$=550 nF, $R_{load}$=5 kΩ, and $T_{sim}$=200 ms. FIG. 9F is a graph which shows the resulting average output voltage $V_{out}$ as a function of the duty cycle ρ. It can be observed that the duty cycle at which the output voltage peaks, i.e. maximum power is transferred to the load, varies with the photo-current $I_{ph}$. Setting the duty cycle such that maximum power is transferred to the load is the function of an MPP controller.

Figure 10B:
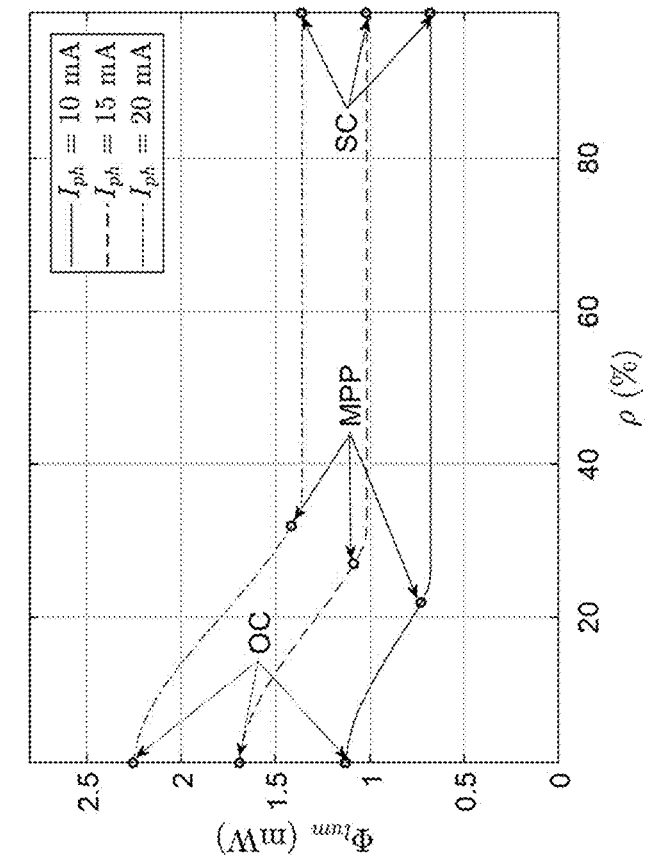
FIG. 10B is a plot of the relationship between luminescent radiant flux of a solar cell employed in FIG. 8 and the duty cycle of the DC-DC converter.
Figure 10A:
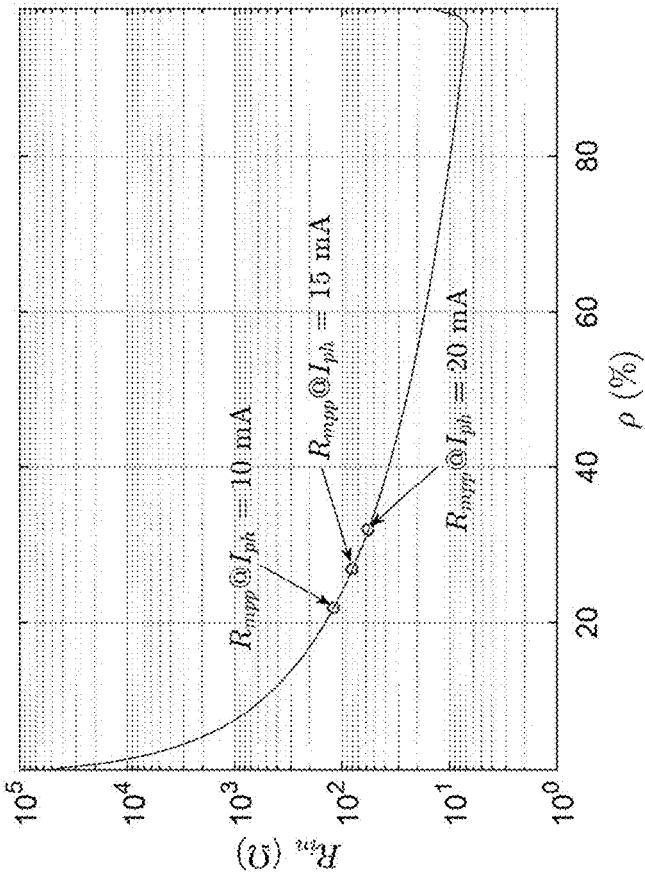
FIG. 10A is a plot of the relationship between input impedance of the DC-DC converter employed in FIG. 8 and the duty cycle of the clock signal.

Referring to FIG. 10A, the relationship between the input impedance of the DC-DC converter 802 (shown in FIG. 8), $R_{in}$, and the duty cycle of the clock signal ρ is presented. This relationship was obtained by first approximating the input impedance of the DC-DC converter 802, $R_{in}$ in the following manner:

$$R_{in} = \frac{\overline{V_c}}{\left(\frac{Q_i}{T_{sw}}\right)} \quad (25)$$

where $\overline{V_c}$ is the average $V_c$ voltage, and
$Q_i$ is the charge drawn by the inductor in one clock cycle.
  The next step in obtaining the relationship was done by assuming a linear profile for the inductor current during Phase 1, when the inductor is charging, and letting $I_{i1}$ and $I_{i2}$ be the inductor currents at the beginning of phases 1 and 2, respectively, the following equation is obtained:

$$Q_i = \int_0^{T_1} \left(I_{i1} + \frac{I_{i2} - I_{i1}}{T_1}\right) dt = I_{i1} T_1 + \frac{T_1}{2}(I_{i2} - I_{i1}) \quad (26)$$

The final step in obtaining the relationship seen in FIG. 10A was to substitute $Q_i$ from (26) into (25) and use the values of $\overline{V_c}$, $I_{i2}$, and $I_{i1}$ obtained from solving the equation describing the DC-DC converter. In FIG. 10A, the impedance of the solar cell 804 (shown in FIG. 8) at the MPP, $R_{mpp}$, is marked for $I_{ph}$=10, 15, and 20 mA. It should be observed that an input impedance greater than $10^4$Ω is achieved for ρ≤2.5%. Furthermore, by combining the relationship for $\Phi_{lum}$ vs. $R_{in}$ from FIG. 7C and the relationship for $R_{in}$ vs. ρ in FIG. 10A yields the relationship for $\Phi_{lum}$ vs. ρ shown in FIG. 10B. FIG. 10B shows that the PL radiant flux of a solar cell 804 can be modulated by varying the duty cycle of the DC-DC converter 802 (shown in FIG. 8).

It is also possible to improve the efficiency of the boost DC-DC converter of FIG. 8 by replacing the Schottky diode with an active diode circuit in order to reduce the losses due to the voltage drop across the Schottky diode. An embodiment of an active diode circuit includes a MOSFET and a voltage comparator. The comparator turns off the MOSFET when its drain-to-source voltage becomes negative. Although the comparator consumes additional power, an on-chip low-power implementation of a DC-DC converter with an active diode is more efficient than an implementation with discrete components. Observations were also made, through testing, that gallium nitride (GaN) blue and green LEDs have a strong PL response when illuminated with violet light (405 nm). This PL response is also a function of the impedance across the LED. Hence, in one embodiment, a proposed PL modulator and EH circuit can be used to modulate the PL emissions of GaN blue and green LEDs. Typically, LEDs have much smaller active areas and higher cost (per unit area) than solar cells. Thus, it may be more beneficial to use LEDs for OFID devices where highly directed and concentrated light beams can be used.

Figure 11A:
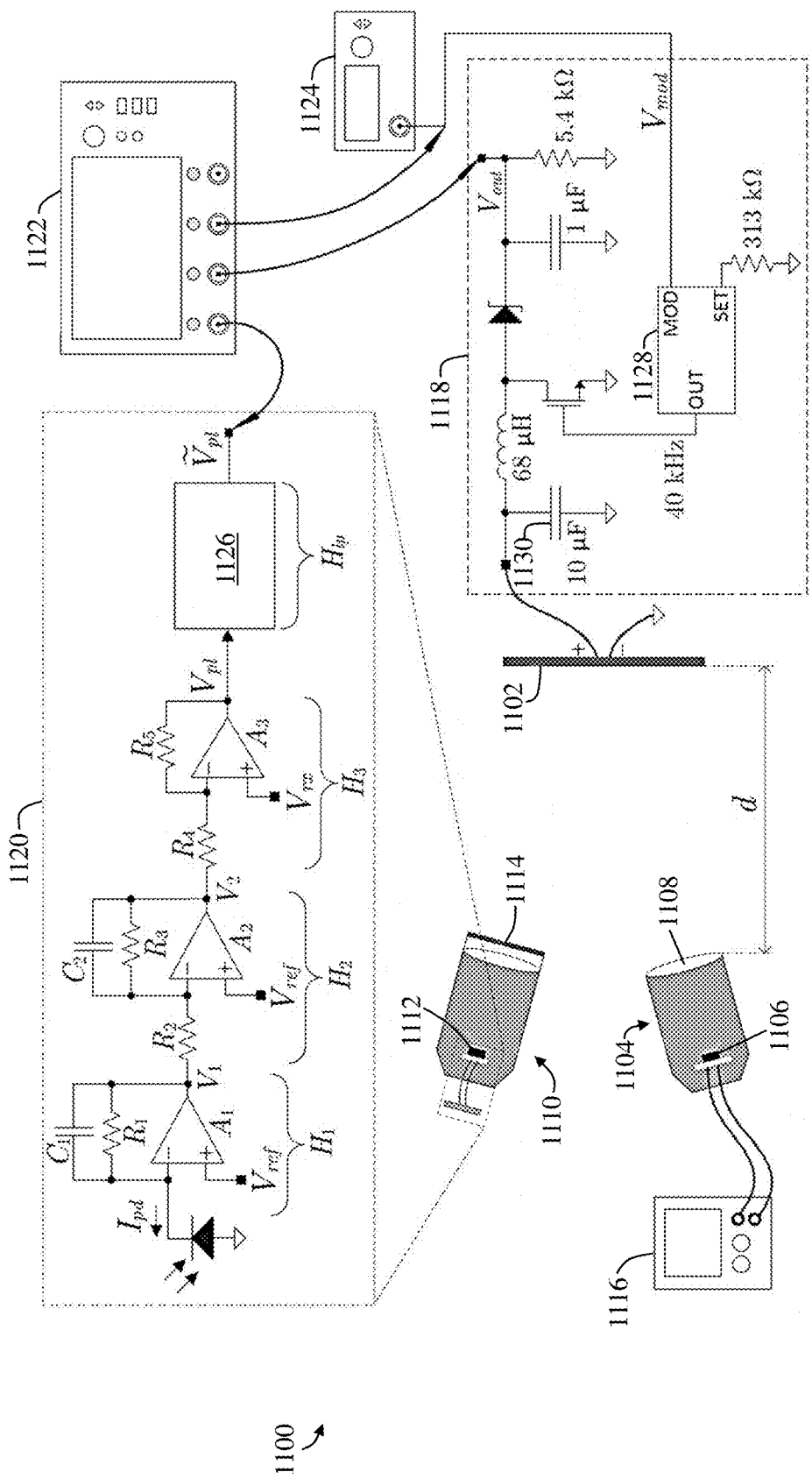
FIG. 11A is a schematic diagram of an experimental setup employed to test the functionality of the circuit proposed in FIG. 8.

Further testing was performed to verify the functionality and validity of analytical models previously presented for an embodiment of the PL modulator and EH circuit. FIG. 11A shows a schematic diagram of the test setup 1100 used to conduct such tests. A GaAs solar cell 1102 was placed in front of a flashlight 1104 having a red (623 nm) LED 1106. The lens 1108 of the LED 1106 was at a distance d from the solar cell, where in one embodiment the distance d was 12 centimeters. In order to operate the flashlight 1104 it was connected to a power supply unit 1116. A second, modified, flashlight 1110, configured to hold a photo-diode 1112 and an amplifier, was also placed in front of the GaAs solar cell 1102. An 850 nm longpass filter 1114 was attached to the modified flashlight 1110 at the end facing the GaAs solar cell 1102. The test setup 1100 further included a PL modulator and EH circuit 1118 which was connected to an oscilloscope 1122 and waveform generator 1124. The PL modulator and EH circuit 1118 was capable of generating a clock signal provided by a voltage-controlled pulse width modulator circuit 1128. A receiver 1120 was also included in the test setup 1100 which was connected to the oscilloscope 1122 and comprising a trans-impedance amplifier, two inverting amplification stages and a low-pass filter 1126. The low-pass filter 1126, was used to remove ripple noise caused by the switching action of the DC-DC converter.

Current through the LED 1106 was adjusted such that the photo-generated current in the solar cell $I_{ph}$ was 20 mA. The photo-diode's 1112 current $I_{pd}$ was converted to a voltage by a trans-impedance amplifier and further amplified to produce the voltage $V_{pl}$, which is proportional to $I_{pd}$. The oscilloscope 1122 was used to record the $V_{pl}$, $V_{mod}$, and $V_{out}$ waveforms. The photo-diode's 1112 current $I_{pd}$ is a function of the solar cell's 1102 radiant flux $\Phi_{lum}$ at distance d, $\Phi_{lum}(d)$, as follows:

$$I_{pd} = R_{pd} \Phi_{lum}(d) \quad (27)$$

where, $R_{pd}$ is the responsivity of the photo-diode 1112 in A/W. Given that $\Phi_{lum}(d) \propto \Phi_{lum}$, it can be concluded that $V_{pl} \propto \Phi_{lum}$. Hence, the $V_{pl}$ waveforms recorded by the oscilloscope were proportional to the luminescent radiant flux emitted by the solar cell 1102. Returning to the pulse width modulator circuit 1128 of the PL modulator and EH circuit 1118, the duty cycle of the clock signal generated is a linear function of the voltage $V_{mod}$ with $V_{mod}$=95 mV corresponding to ρ=0% duty cycle and $V_{mod}$=900 mV corresponding to ρ=100% duty cycle. The switching frequency was set to 40 kHz. The low-pass filter 1126 implemented was an eighth order Butterworth low-pass filter with a cutoff frequency set to 20 kHz. Other parameters of the receiver 1120 were set as follows: $R_1$=100 kΩ, $C_1$=11 pF, $R_2$=10 kΩ, $C_2$=62 pF, $R_3$=1 MΩ, $R_4$=9.8 kΩ, $R_5$=9.8 kΩ, and $V_{ref}$=1.5 V.

Figure 11B:
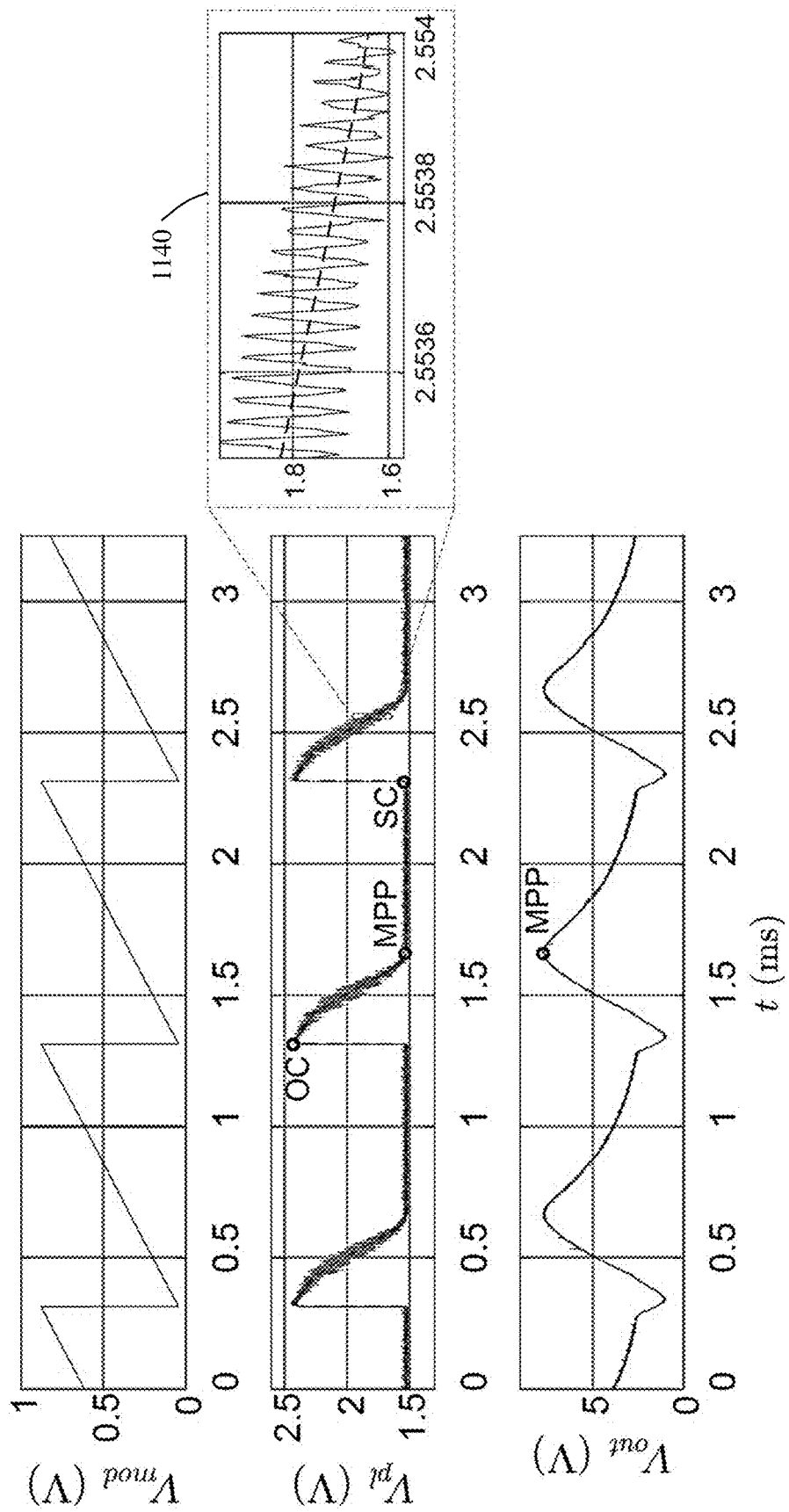
FIGS. 11B-11C and recorded waveforms of the different tests performed based on the circuit provided in FIG. 11A.

The first test conducted involved sweeping $V_{mod}$ from 95 mV to 900 mV to observe the effects of duty cycle change on $V_{pl}$ and on the output of the DC-DC converter, $V_{out}$. FIG. 11B shows the recorded $V_{mod}$, $V_{pl}$, and $V_{out}$ waveforms. The inset 1140 shows a closeup view of the ripple noise in $V_{pl}$, which is due to the switching action of the DC-DC converter. The dotted line is the low-pass version of $V_{pl}$ with the ripple removed. It should be observed that, $V_{pl}$, which is proportional to $\Phi_{lum}$, achieves its maximum for ρ=0% or $V_{mod}$=95 mV (OC) and its minimum for ρ=100% or $V_{mod}$=900 mV (SC). The MPP, which is the point at which $V_{out}$ is maximum is achieved for $V_{mod}$=355 mV or ρ=32.7% duty cycle. The location of the MPP and the overall behavior of $V_{out}$ with respect to ρ is in good agreement with the results presented in FIG. 9F. Furthermore, the $V_{pl}$ waveform, after ripple noise was removed, is also in good agreement with the relationship between $\Phi_{lum}$ and the duty cycle p presented in FIG. 10B. At the MPP, $V_{out}$=8 V, resulting in 11.9 mW of power delivered to the load. Considering that for $I_{ph}$=20 mA, $V_{pp} \times I_{mpp}$=17.7 mW, the efficiency of the DC-DC converter, at the MPP, is 67%.

A second test that included varying the amplitude of the emitted PL radiant flux in discrete steps was also carried out. This test shows the possibility of using PAM to transmit digital information with PL emissions of a solar cell 1102. To this end, $V_{mod}$ was varied in eight discrete levels, wherein each level corresponded to a digital symbol ranging from 95 mV (OC) to 355 mV (MPP). Due to the non-linear relationship between $\Phi_{lum}$ and the duty cycle ρ, the levels were not equally spaced. Table 1 lists the $V_{mod}$ voltage values and the corresponding duty cycles assigned to each symbol.

TABLE 1

$V_{mod}$ and ρ values for transmitted symbols

| Symbol | $V_{mod}$ (mV) | ρ (%) |
|---|---|---|
| 000 | 95 | 0 |
| 001 | 165 | 8.7 |
| 010 | 210 | 14.7 |
| 011 | 240 | 18.7 |
| 100 | 260 | 21.3 |
| 101 | 285 | 24.4 |
| 110 | 315 | 28.1 |
| 111 | 355 | 32.7 |

Figure 11C:
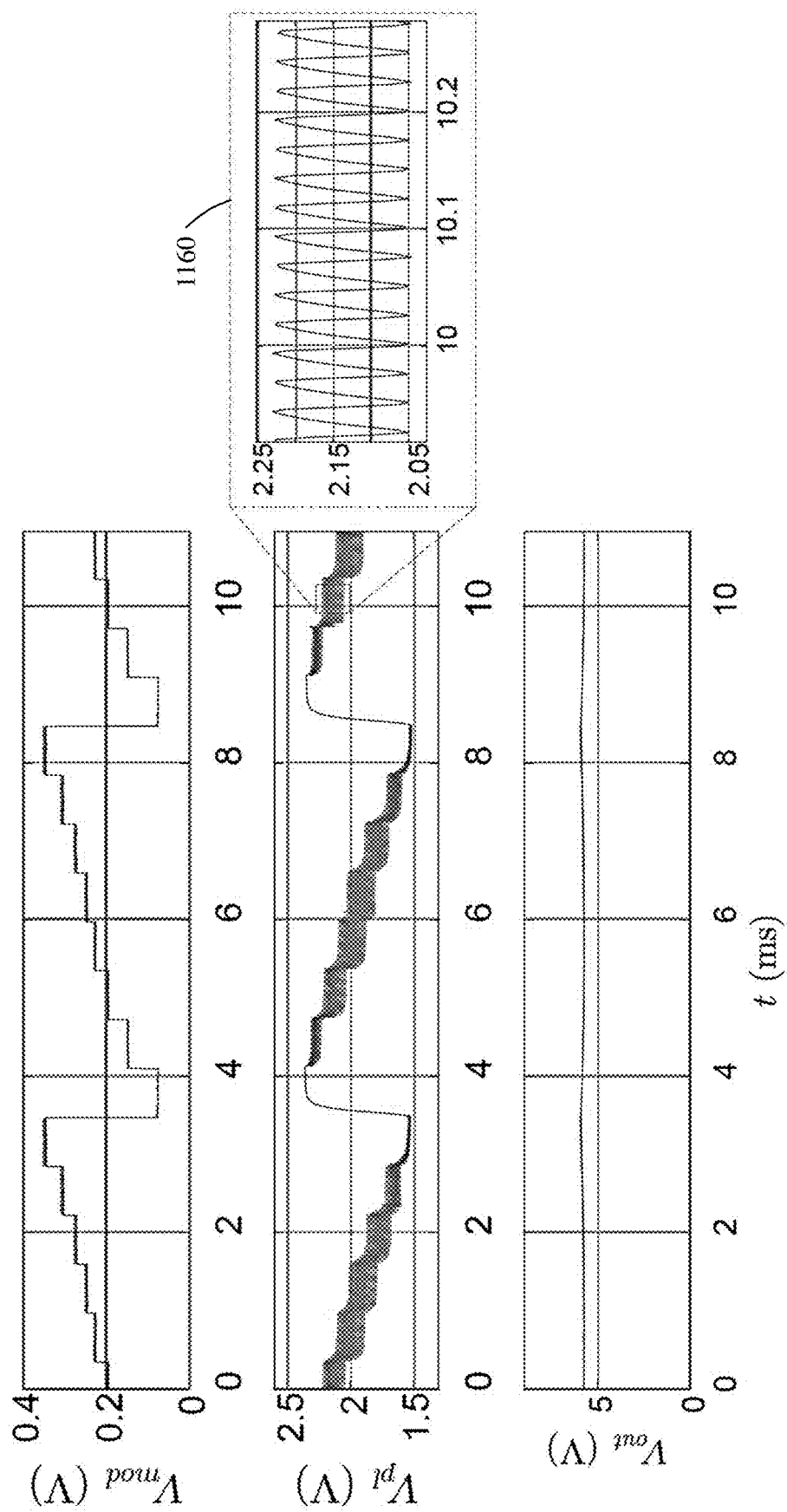
Figure 11D:
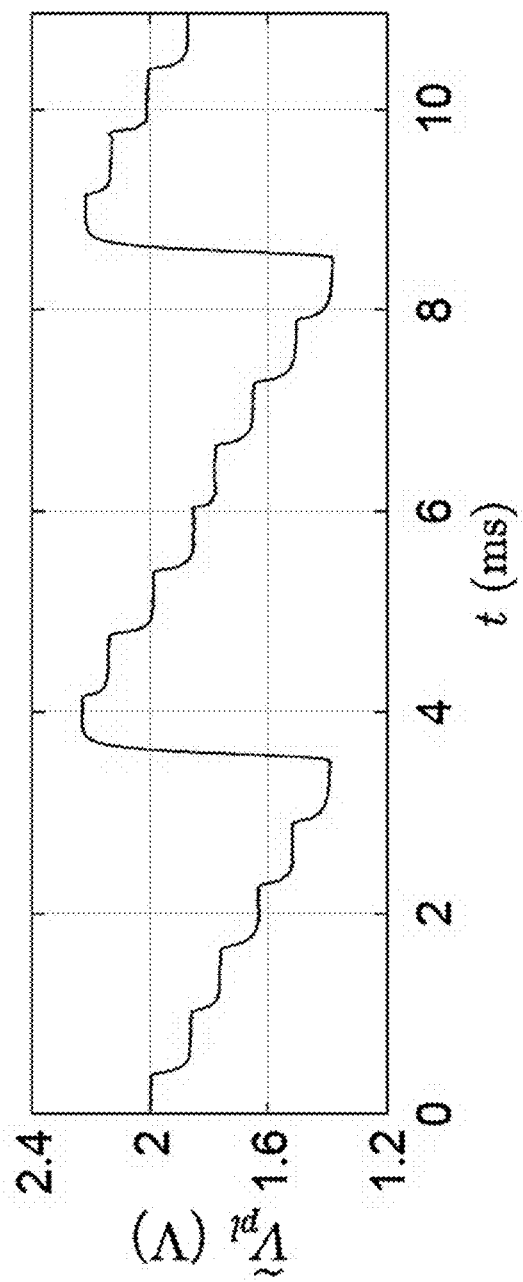
FIG. 11D is a graph of voltage vs. time representing output of an 8th order low-pass filter.

With further reference to the second test performed, FIG. 11C shows the $V_{mod}$, $V_{pl}$, and $V_{out}$ waveforms recorded by the oscilloscope for that test. The inset here 1160 shows a closeup view of the ripple noise in $V_{pl}$. At the receiver side, this noise is removed by the low-pass filter 1126 for reliable reception of the transmitted symbols. FIG. 11D shows graphically the output of the low-pass filter 1126 $\tilde{V}_{pl}$, and, as seen in the figure, a cleaner more distinguishable signal with the eight discrete levels can be identified. In this second test, the duration of each symbol was set to 0.625 ms, which would result in a transmissions speed of 4.8 kbps. FIG. 11C also shows that the output of the DC-DC converter dropped to 5.99 V, as a result of the modulation, resulting in 6.54 mW of power delivered to the load. This drop is due to the fact that, in order to modulate the PL emissions of the solar cell 1102 by varying the input impedance of the DC-DC converter, the DC-DC converter does not always operate at the MPP. This result illustrated an inherent trade-off in the proposed PL modulator and EH circuit 1118, namely, the ability of harvesting maximum power is traded with the ability of transmitting information.

Depending on the requirements of the target application, either power harvesting or information transmission may be maximized. For example, to maximize power harvesting while transmitting information, the variations in duty cycle should be kept close to the MPP. This would mean that either: 1) fewer discrete levels (symbols) are transmitter per unit time or 2) the spacing between each level is reduced. In either case the transmission of information is hindered by a reduction of the transmission rate or a reduction of the signal-to-noise ratio.

Figure 11E:
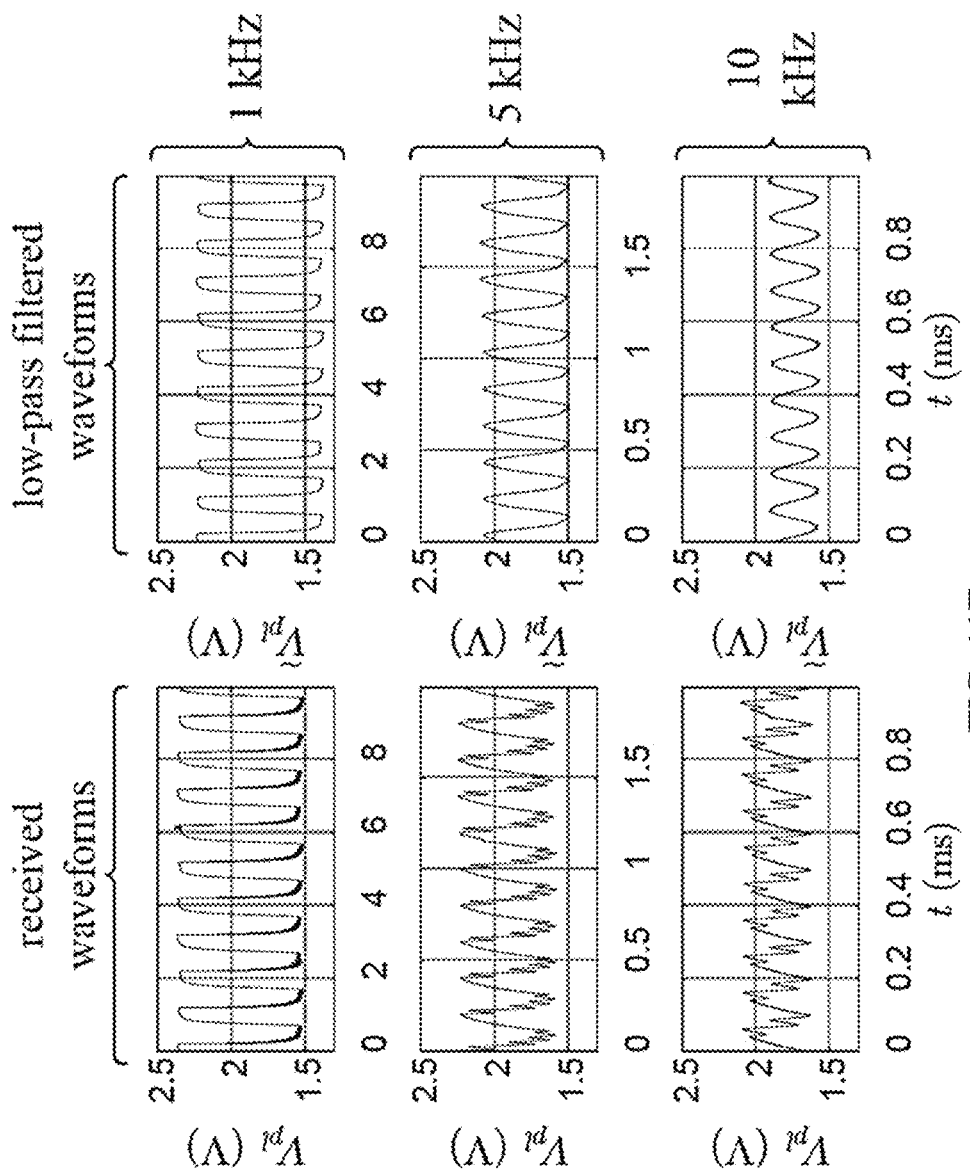
FIG. 11E is a collection of graphs of voltage vs. time for recorded waveforms for an on-off keying modulation for three frequencies: 1 kHz (top row), 5 kHz (middle row) and 10 kHz (bottom row).

A third test was carried out to demonstrate the performance of OOK modulation. In this test the PL radiant flux was modulated by flipping $V_{mod}$ between 95 mV (OC) and 355 mV (MPP). FIG. 11E shows the recorded $V_{pl}$ waveforms for three different modulation frequencies: 1 kHz (top row), 5 kHz (middle row), and 10 kHz (bottom row). In each row, $V_{pl}$ and $\tilde{V}_{pl}$ in volts are plotted vs. time in ms. It can be seen from this figure, that as the modulation frequency increases, the amplitude of $V_{pl}$ decreases. This decrease in amplitude is due to capacitor 1130 which limits how fast the DC-DC converter can reach its steady state after a change in the duty cycle. This is another example of a trade-off in the PL modulator and EH circuit 1118, depending on the requirements of the target applications, the value of capacitor 1130 should be set to either maximize harvested power or maximize the transmission bandwidth.

Figure 12:
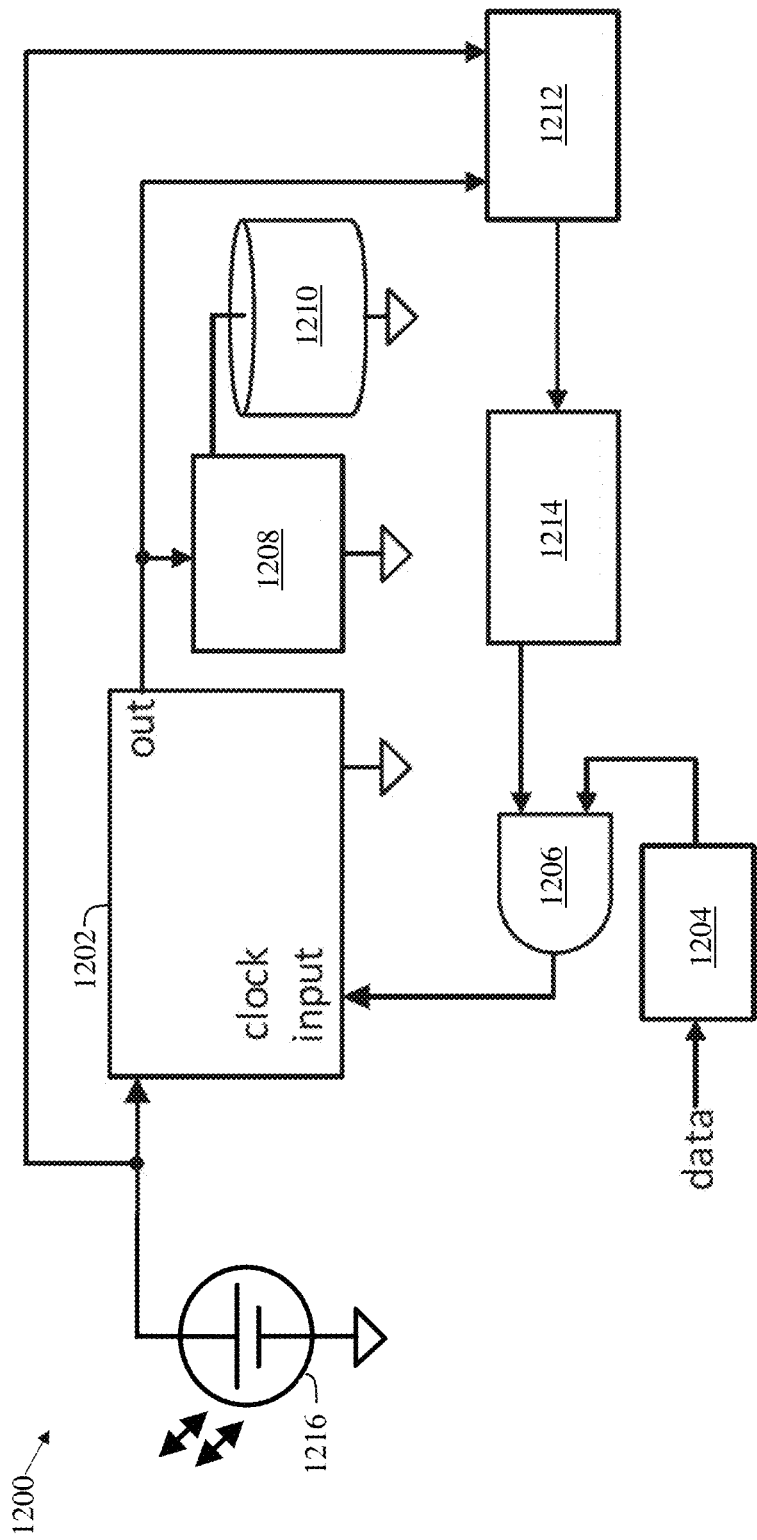
FIG. 12 is a schematic diagram of a PL modulator circuit, according to one embodiment of the present disclosure.

Referring to FIG. 12, a schematic diagram of a PL modulator circuit 1200, according to one embodiment of the present disclosure, is shown. The PL modulator circuit 1200 comprises: a power converter 1202, line encoder 1204 and an AND logic gate 1206. The PL modulator circuit 1200 further comprises a load/charger circuit 1208, an energy reservoir 1210, an MPP controller 1212, a pulse modulator 1214, and a solar cell 1216. The power converter 1202 includes an input, a clock input and an output. The output of the power converter 1202 feeds into the input of the MPP controller 1212 and the input of load/charger circuit 1208. The load/charger circuit 1208 also has an output that is connected to the energy reservoir 1210 and is adapted to transfer charge to the energy reservoir 1210. The output of the MPP controller 1212 feeds into the input of the pulse modulator 1214, and the output of the pulse modulator 1214 feeds into one terminal of the AND logic gate 1206. Data feeds into the line encoder 1204, which then encodes said data and outputs the encoded data to the remaining terminal of the AND logic gate 1206. In this embodiment, the MPP controller 1212 continuously adjusts the duty cycle or the frequency of a sequence of pulses generated by the pulse modulator 1214. The output of the AND logic gate 1206 drives the clock input of the power converter 1202. The solar cell circuits of the prior art do not include the ability to modulate luminescent emissions and as such do not include the line encoder 1204 or the AND gate 1206, as shown in FIG. 28.

Figure 13:
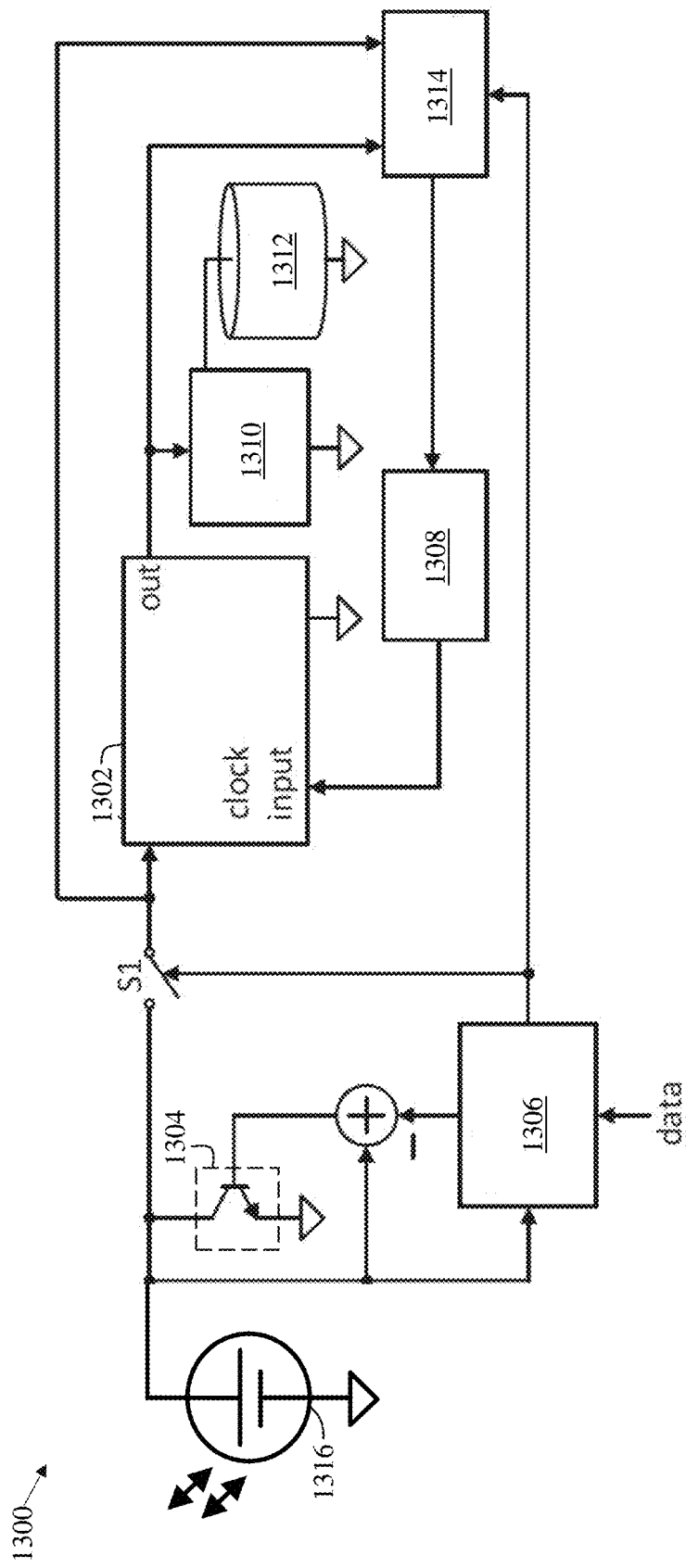
FIG. 13 is a schematic diagram of a PL modulator circuit, according to one embodiment of the present disclosure.

Referring to FIG. 13, a schematic diagram of a PL modulator circuit 1300, according to one embodiment of the present disclosure, is shown. The PL modulator circuit 1300 comprises: a power converter 1302, a bipolar transistor 1304 within a feedback loop, and a switch S1. The PL modulator circuit 1300, further comprises a symbol-to-voltage mapping circuit 1306, a pulse modulator 1308, a load/charger circuit 1310, an energy reservoir 1312, an MPP controller 1314 and a solar cell 1316. The power converter 1302 has an input, a clock input, and an output. The output of the power converter 1302 feeds into an input of the MPP controller 1314 and the input of the load/charger circuit 1310. The output of the load/charger circuit 1310 feeds into the energy reservoir 1312, making it possible for the load/charger circuit 1310 to store excess energy in the energy reservoir 1312. The MPP controller 1314 output connects to the input of the pulse modulator 1308 and the output of the pulse modulator 1308 drives the clock input of the power converter 1302. The PL modulator circuit 1300 operates in two modes: transmission mode (TX) and energy harvesting mode (EH). In EH mode, the switch S1 is closed, the bipolar transistor 1304 is turned off and the MPP controller 1314 is enabled. In TX mode, the switch S1 is open, the MPP controller 1314 is disabled and the base of the bipolar transistor 1304 is driven by the feedback loop such that the voltage across the solar cell 1316 varies according to the data being transmitted.

Figure 14:
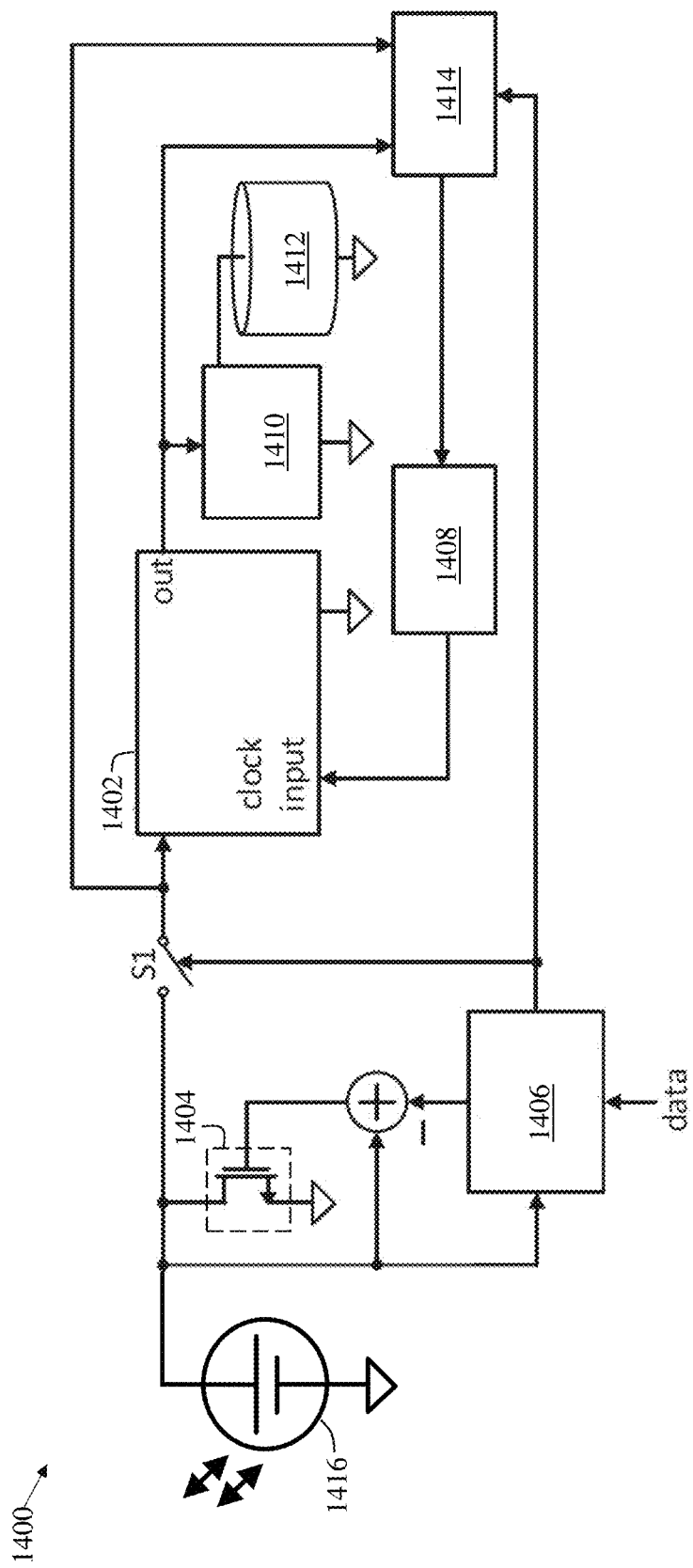
FIG. 14 is a schematic diagram of a PL modulator circuit, according to one embodiment of the present disclosure.

Referring to FIG. 14, a schematic diagram of a PL modulator circuit 1400, according to one embodiment of the present disclosure, is shown. FIG. 14 is similar to FIG. 13 with some difference, therefore duplicative description of the connectivity is avoided. The PL modulator circuit 1400 comprises: a power converter 1402, a MOSFET 1404 within a feedback loop, and a switch S1. The PL modulator circuit 1400 further comprises: a symbol-to-voltage mapping circuit 1406, a pulse modulator 1408, a load/charger circuit 1410, an energy reservoir 1412, an MPP controller 1414, and a solar cell 1416. The PL modulator circuit 1400 operates in two modes: a transmission mode (TX) and an energy harvesting mode (EH). In EH mode, the switch S1 is closed, the MOSFET 1404 is turned off and the MPP controller 1414 is enabled. In TX mode, the switch S1 is open, the MPP controller 1414 is disabled and the gate of the MOSFET 1404 is driven by the feedback loop such that the voltage across the solar cell 1416 varies according to the data being transmitted.

Figure 15:
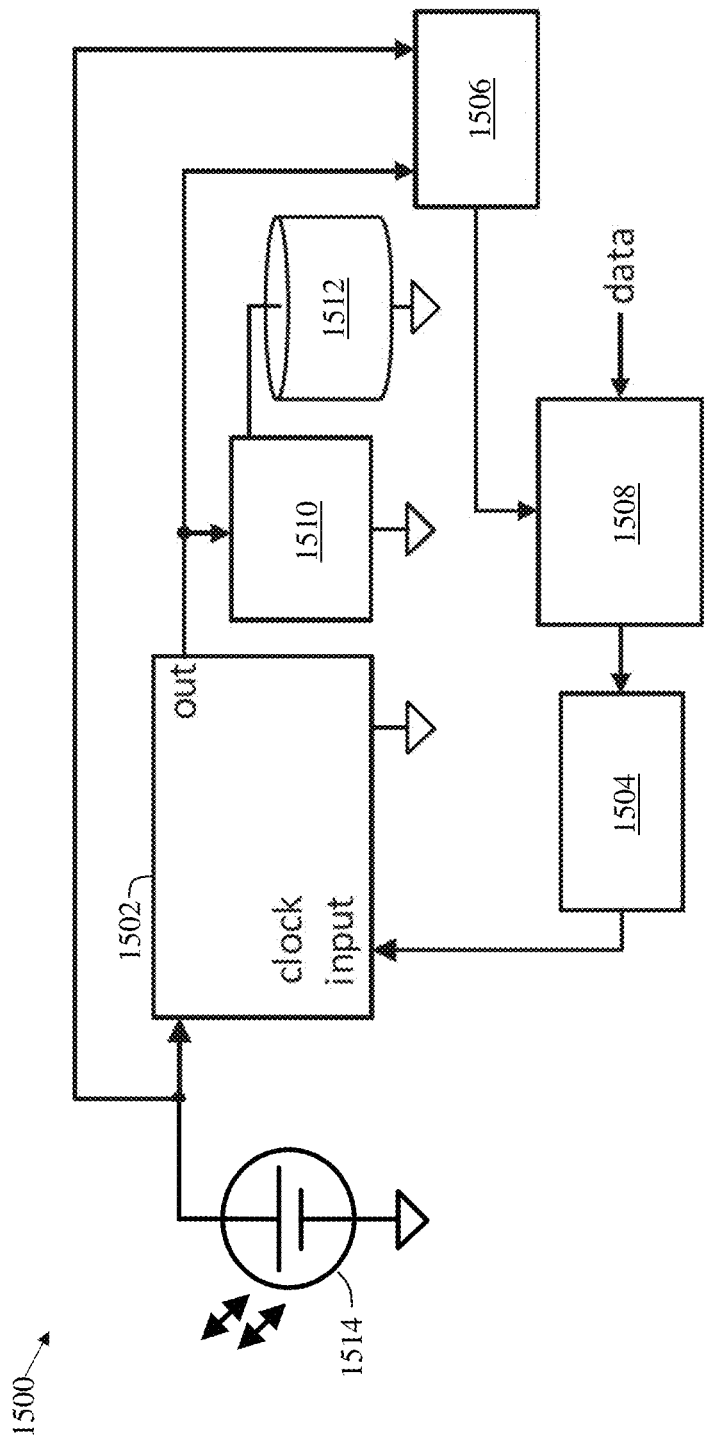
FIG. 15 is a schematic diagram of a PL modulator circuit, according to one embodiment of the present disclosure.

Referring to FIG. 15, a schematic diagram of a PL modulator circuit 1500, according to one embodiment of the present disclosure, is shown. The PL modulator circuit 1500 comprises: a power converter 1502, a variable oscillator 1504, an MPP controller 1506 and a symbol-to-frequency mapping circuit 1508 that assigns a frequency to each symbol in a set of data to be transmitted. The PL modulator circuit 1500 further comprises: a load/charger circuit 1510, an energy reservoir 1512 and a solar cell 1514. The frequency output of the variable oscillator 1504 is a function of the data being transmitted and the output of the MPP controller 1506. The symbol-to-frequency mapping circuit 1508 assigns a frequency to each symbol in the set of data being transmitted such that input impedance of the power converter 1502 changes from short circuit to a very large impedance (i.e. greater than 10 kOhms).

Figure 16:
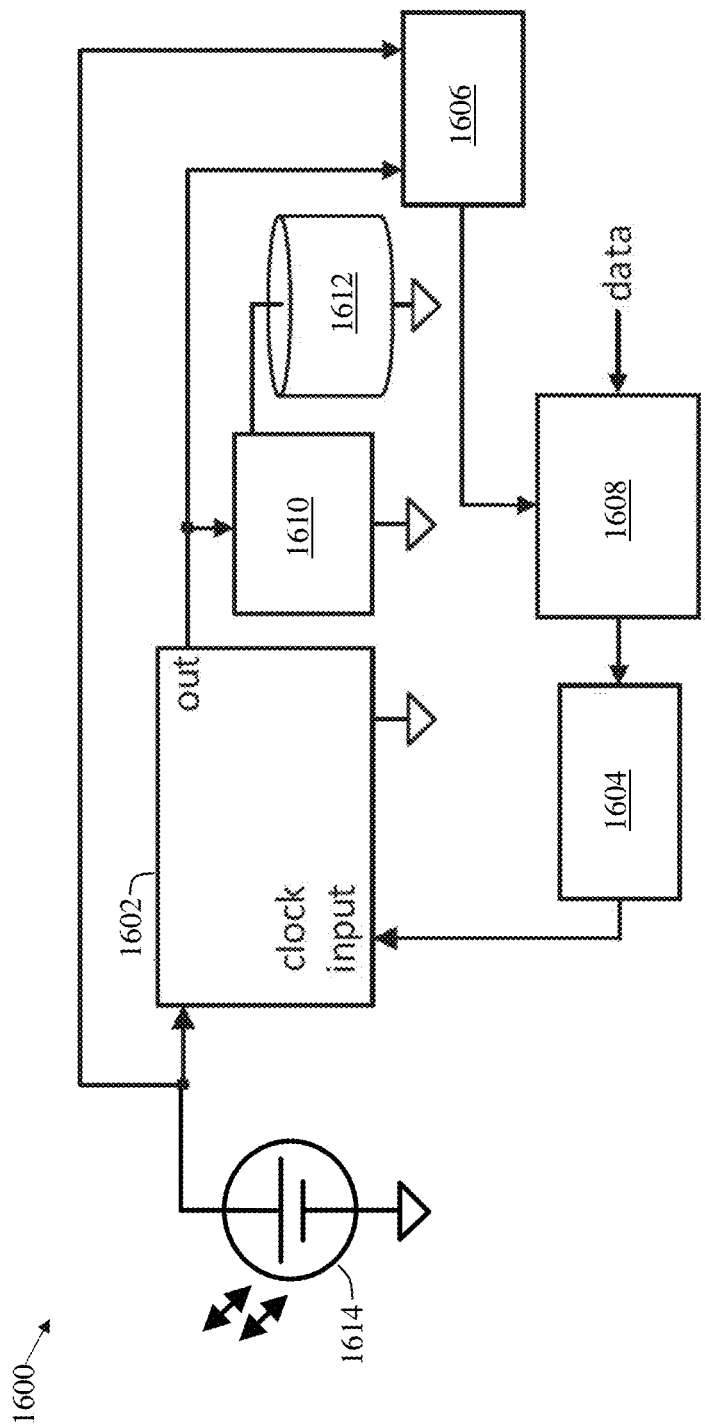
FIG. 16 is a schematic diagram of a PL modulator circuit, according to one embodiment of the present disclosure.

Referring to FIG. 16, a schematic diagram of a PL modulator circuit 1600, according to one embodiment of the present disclosure, is shown. The PL modulator circuit 1600 comprises: a power converter 1602, a pulse width modulator 1604, an MPP controller 1606, and a symbol-to-duty-cycle mapping circuit 1608 that assigns a duty cycle or pulse width to each symbol in a set of data to be transmitted. The PL modulator circuit 1600 further comprises: a load/charger circuit 1610, an energy reservoir 1612, and a solar cell 1614. The duty cycle of the pulse width modulator 1604 is a function of the data being transmitted and the output of the MPP controller 1606. The symbol-to-duty-cycle mapping circuit 1608 assigns a duty cycle to each symbol in the set of data being transmitted such that input impedance of the power converter 1602 changes from short circuit to a very large impedance (i.e. an impedance greater than 10 kOhms).

Figure 17:
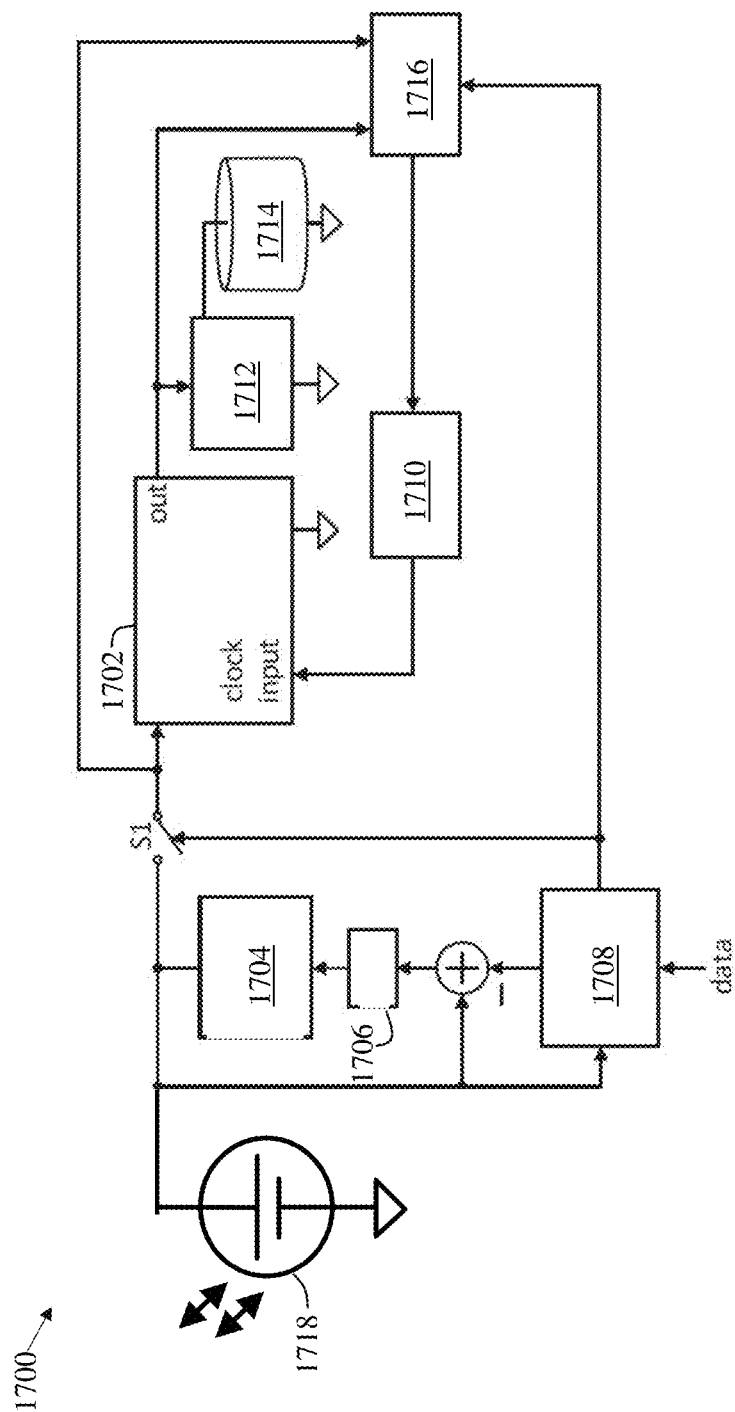
FIG. 17 is a schematic diagram of a PL modulator circuit, according to one embodiment of the present disclosure.

Referring to FIG. 17, a schematic diagram of a PL modulator circuit 1700, according to one embodiment of the present disclosure, is shown. The PL modulator circuit 1700 comprises: a power converter 1702, a digital potentiometer 1704, an analog-to-digital (A/D) converter 1706, a symbol-to-voltage mapping circuit 1708 and a switch S1. The PL modulator circuit 1700 further comprises: a pulse modulator 1710, a load/charger circuit 1712, an energy reservoir 1714, an MPP controller 1716, and a solar cell 1718. The PL modulator circuit 1700 operates in two modes: transmission mode (TX) and energy harvesting mode (EH). In EH mode the switch S1 is closed, the MPP controller 1716 is enabled and the output from the digital potentiometer 1704 is set to high impedance. In TX mode the switch S1 is open, the MPP controller 1716 is disabled and the output resistance from the digital potentiometer 1704 is set such that the voltage across the solar cell 1718 closely follows the voltage output of the symbol-to-voltage mapping circuit 1708. The symbol-to-voltage mapping circuit 1708 assigns a voltage to each symbol in a data stream which is to be transmitted such that the voltage output of the symbol-to-voltage mapping circuit 1708 spans the range from 0 V to the open circuit (OC) voltage of the solar cell 1718.

Figure 18:
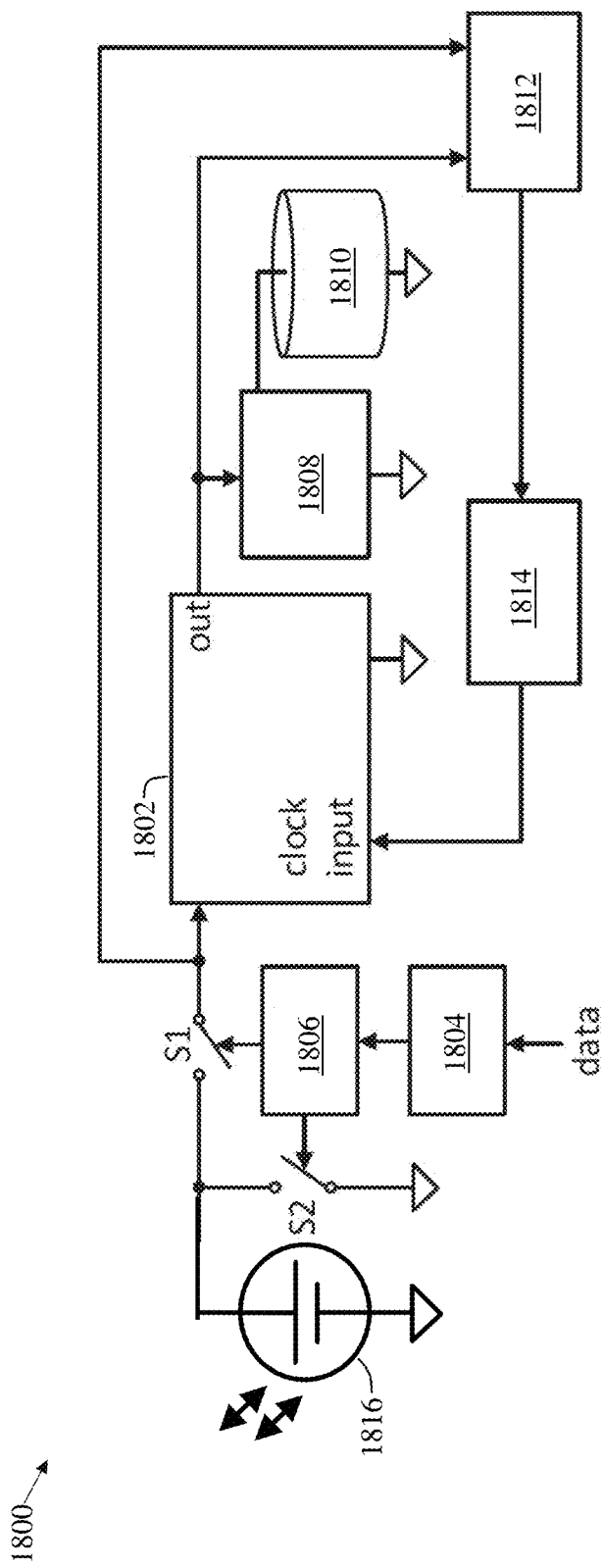
FIG. 18 is a schematic diagram of a PL modulator circuit, according to one embodiment of the present disclosure.

Referring to FIG. 18, a schematic diagram of a PL modulator circuit 1800, according to one embodiment of the present disclosure, is shown. The PL modulator circuit 1800 comprises: a power converter 1802, two switches S1 and S2, a line encoder 1804, a switch driver 1806, a load/charger circuit 1808, an energy reservoir 1810, an MPP controller 1812, a pulse modulator 1814, and a solar cell 1816. The PL modulator circuit 1800 operates in two modes: transmission mode (TX) and energy harvesting mode (EH). In EH mode S1 is closed, the MPP controller 1812 is enabled and S2 is open. In TX mode, the following two sub-modes are possible: S1 remains open and S2 opens and closes according to the data being transmitted, S1 and S2 open and close out of phase (i.e. when S1 is open, S2 is closed) according to the data being transmitted. In the sub-mode when S1 is open and S2 is closed there is a short circuit (SC) event leading to a maximum current draw resulting in an almost 0 V across the solar cell. This results in a minimum amount of luminescence being generated by the solar cell 1816. Such luminescence is infrared for materials such as GaAs or CdTe. However, perovskite solar cell may provide luminescence in the visible range, i.e. red or green. In the event that both switches S1 and S2 are open, resulting in an open circuit (OC) event the impedance across the solar cell 1816 is infinite and the solar cell 1816 achieves a maximum luminescent emission. In the scenario that switch S1 is closed and switch S2 is open, the power converter 1802 applies a level of impedance equivalent to the MPP to the solar cell 1816, resulting in a median level of luminescent emissions ranging between minimum and maximum emissions. The MPP controller 1812 may be disabled when S1 is open.

Figure 19:
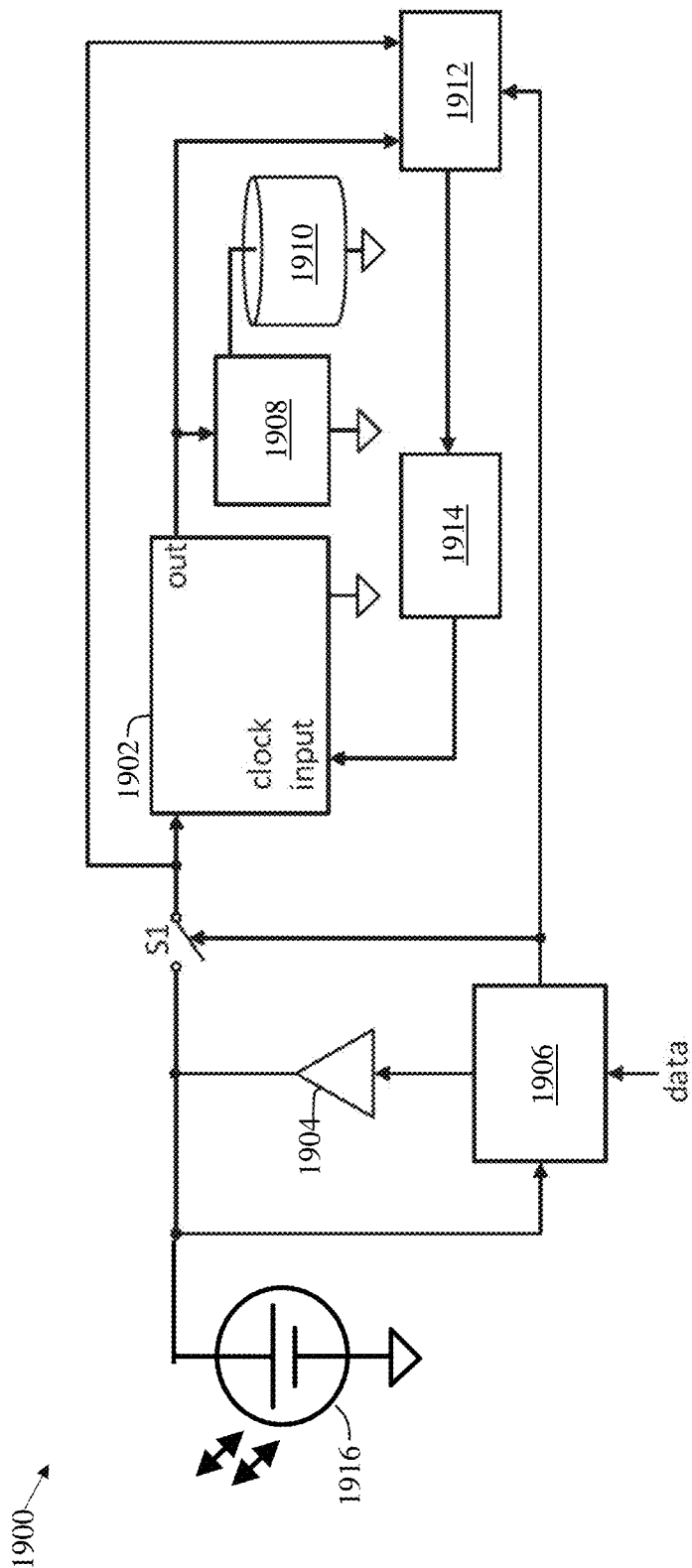
FIG. 19 is a schematic diagram of a PL modulator circuit, according to one embodiment of the present disclosure.

Referring to FIG. 19, a schematic diagram of a PL modulator circuit 1900, according to one embodiment of the present disclosure, is shown. The PL modulator circuit 1900 comprises: a power converter 1902, a voltage buffer 1904, a symbol-to-voltage mapping circuit 1906, a switch S1, a load/charger circuit 1908, an energy reservoir 1910, an MPP controller 1912, a pulse modulator 1914, and a solar cell

1916. The circuit operates in two modes: transmission mode (TX) and energy harvesting mode (EH). In EH mode the switch S1 is closed, the MPP controller 1912 is enabled and the output from the voltage buffer 1904 is set to high impedance. In TX mode the switch S1 is open, the MPP controller 1912 is disabled and the output of the voltage buffer 1904 follows the output of the symbol-to-voltage mapping circuit 1906. The symbol-to-voltage mapping circuit 1906 assigns a voltage to each symbol in a data stream being transmitted such that its voltage output spans the range from 0 V to the open circuit (OC) voltage of the solar cell 1916.

According to the present disclosure, there are numerous potential applications for an OFID communications system. One potential application for an OFID communication system is environmental monitoring. The OFID communication system could be equipped with sensors to monitor environmental variables such as water or air contaminants. According to this application, solar energy could be used for both powering the sensor and for stimulating PL emissions from the solar cells that can be modulated with data from the sensors. Furthermore, it would be possible for an unmanned air vehicle (UAV) equipped with a passive imaging receiver, such as a high-speed infrared camera, to detect the modulated PL emissions of the solar cells. The camera would be able to receive and spatially separate several transmissions simultaneously and be able to locate the position of the sensors to determine their location relative to the surroundings. Multiple sensor units could be deployed over an area to provide greater range. OFID communications systems also offer a potential use in identifying and tracking large objects such as shipping containers as they move through a port. In this application, an active reader with a high-power collimated light beam, possibly from a laser source, could be used to interrogate an OFID tag, attached to the shipping container, from a long distance. In this application the OFID communication system would not require active power from batteries, supporting its long-term and sustainable usage on objects used for transportation of goods over a long distance such as, shipping, trucking or railway containers.

Another possible application of an OFID communication system is the tracking and monitoring of perishable goods, such as foods or vaccines, throughout the different points of a supply chain. According to this application, as a package carrying said perishable good moves through the supply chain, its presence at different points in the supply chain can be detected by optically interrogating an OFID communication system. Moreover, the OFID communication system can be equipped with at least one temperature sensor to determine if the goods have been kept under recommended conditions. The on-board solar cell would allow the OFID communication system to stay active and record temperature, even when it is not within range of a reader, by harvesting incident light energy. OFID communication systems also offer potential applications in smart-home environments. In these environments OFID communication systems could monitor variables such as temperature, noise, light intensity, air quality or human presence while their on-board solar cells harvest energy from incident light. In this application, PL or EL emissions from the solar cell could be modulated according to the sensed variables. A passive reader equipped with an imaging receiver can be employed to receive multiple luminescence emissions and pinpoint their locations within the room.

Figure 20:
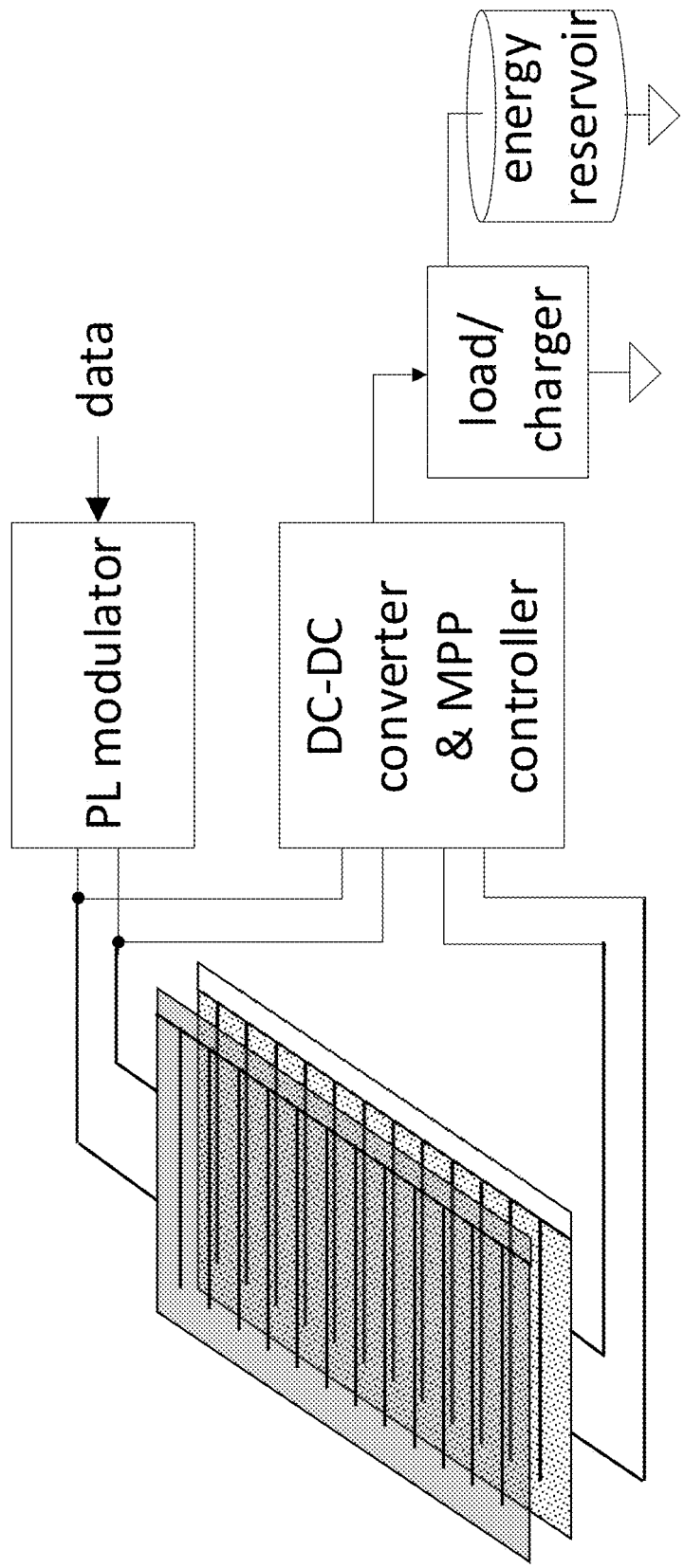
FIGS. 20 and 21 are schematics of two embodiments of the PL modulation according to the present disclosure including tandem solar cells.
Figure 21:
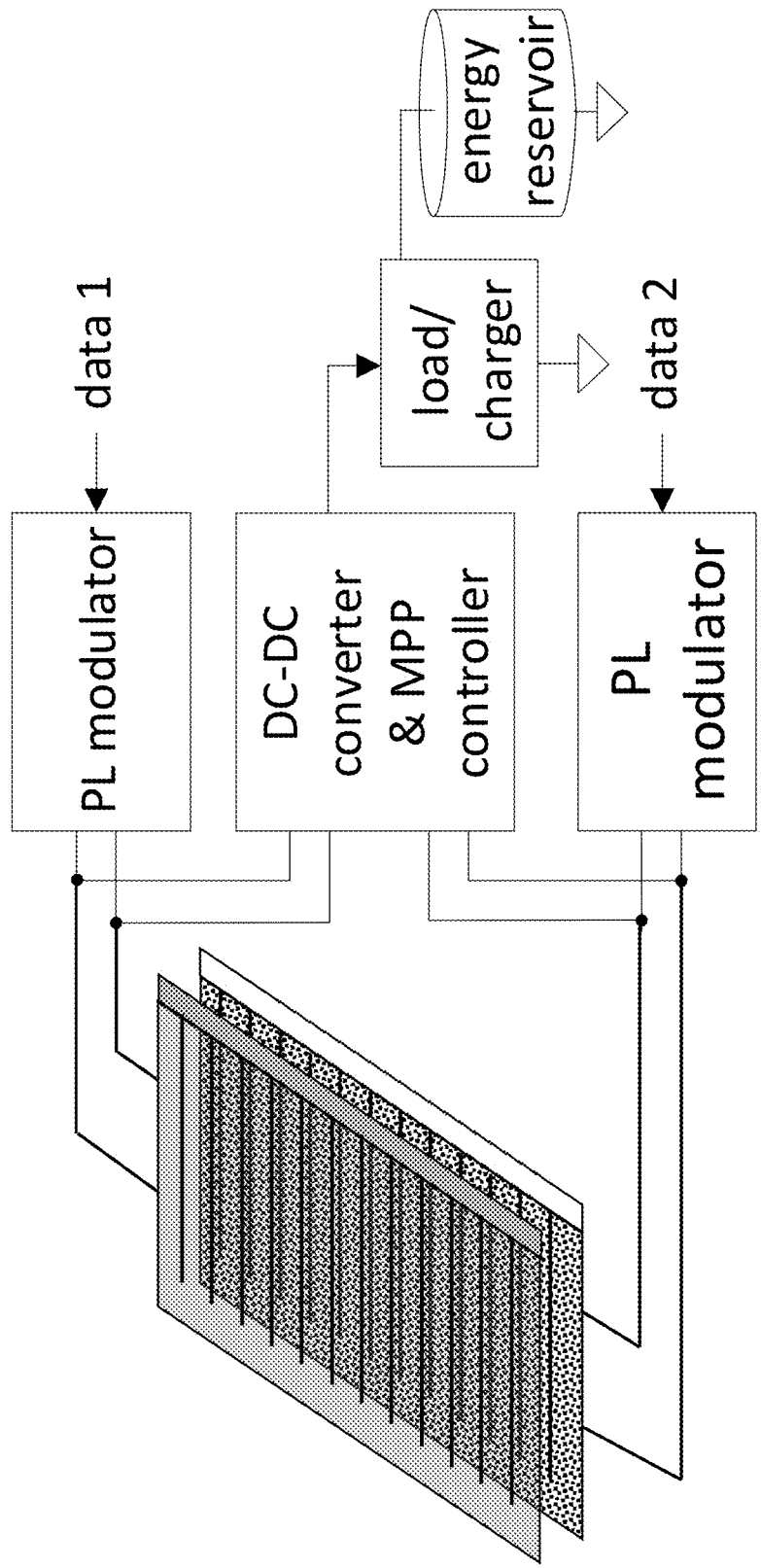

Referring to FIGS. 20 and 21, two embodiments of the PL modulation including tandem solar cells according to the present disclosure are provided. In these two embodiments, solar cells are provided in a tandem manner. Tandem solar cells are known. Such arrangements are provided when one solar cell, e.g., the top transparent or semi-transparent solar cell, is particularly adapted to absorb light at a first spectral range, while the second solar cell, i.e., the bottom solar cell, is adapted to absorb light that is transmitted through the first solar cell at a second spectral range. Such arrangements provide more suitable efficiency across a wider range of light spectrum.

Referring to FIG. 20, the top solar cell is also adapted to PL modulate data. That is, while the top solar cell is adapted to absorb light and provide charge to the DC-DC converter, it is also adapted to emit luminescent radiation as discussed according to any of the data transmission techniques discussed above. At the same time, the bottom solar cell is adapted to provide charge to the DC-DC converter.

Referring to FIG. 21, the top solar cell and the bottom solar cell are also adapted to PL modulate data. That is, the while the top solar cell is adapted to absorb light and provide charge to the DC-DC converter, it is also adapted to emit luminescent radiation as discussed according to any of the data transmission techniques discussed above. At the same time, the bottom solar cell is adapted to provide charge to the DC-DC converter, in addition it is adapted to emit luminescent radiation again as discussed according to any of the data transmission techniques discussed above.

While the discussion above has been mainly directed to PL modulation, EL modulation as discussed previously is also within the scope of the present disclosure. Towards this end, FIGS. 22-27 are presented to showcase various embodiments of EL modulation; however, other embodiments previously discussed in the priority document of the present disclosure (i.e., U.S. Provisional Patent Application Ser. No. 62/727,315 filed Sep. 5, 2018), which is incorporated by reference in its entirety, is also within the scope of the present disclosure.

Figure 22:
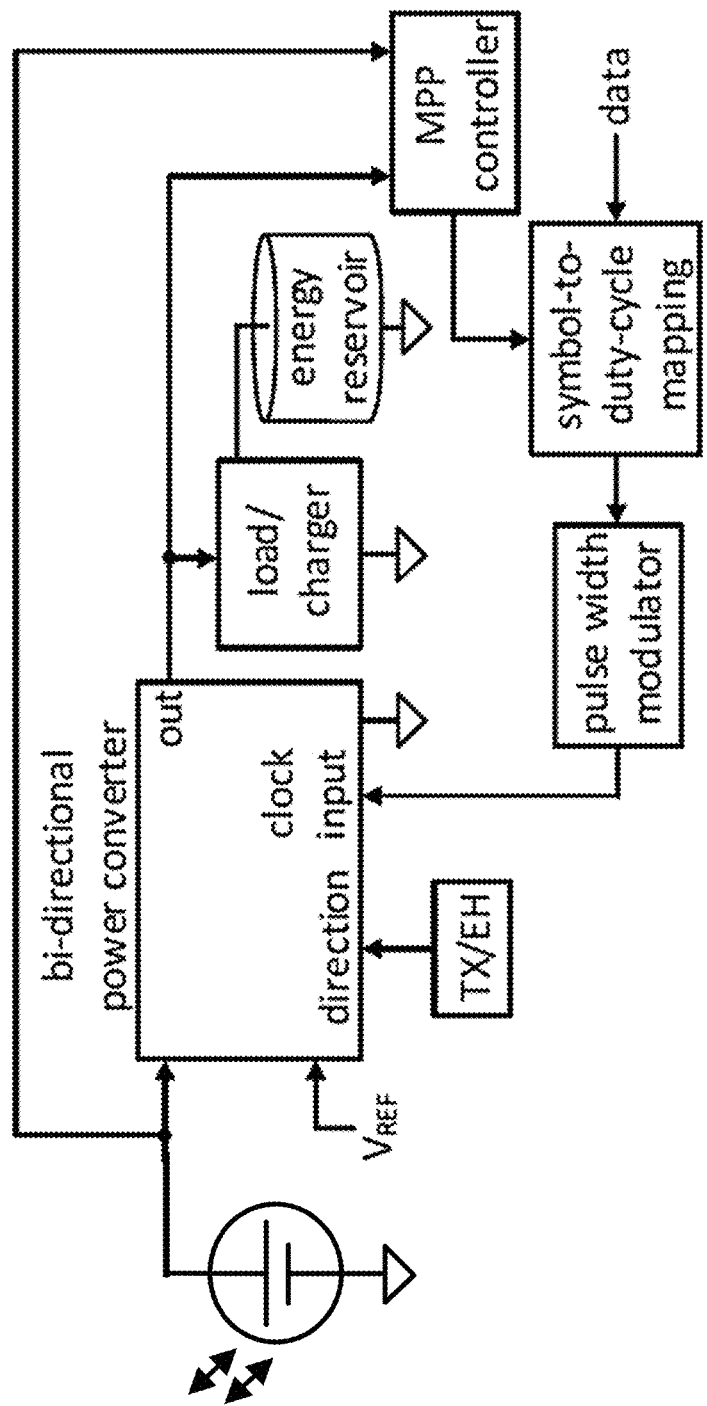
FIG. 22 is an embodiment of the EL modulation circuit, according to the present disclosure.

Referring to FIG. 22, an embodiment of the EL modulation circuit is provided. The EL modulator shown in FIG. 22 uses a bidirectional power converter and can modulate both PL and EL. The TX/EH signal sets the operation mode of the circuit. The operation mode can be set to data transmission (TX) or to energy harvesting (EH). The TX/EH signal sets the direction of power converter. In the forward direction the power converter transfers energy from the solar cell to the load or to a charger (EH mode). In the reverse direction the power converter transfers energy from the energy reservoir toward the solar cell (TX mode). The duty cycle of the clock input of the power converter is varied according to the data being transmitted.

Figure 23:
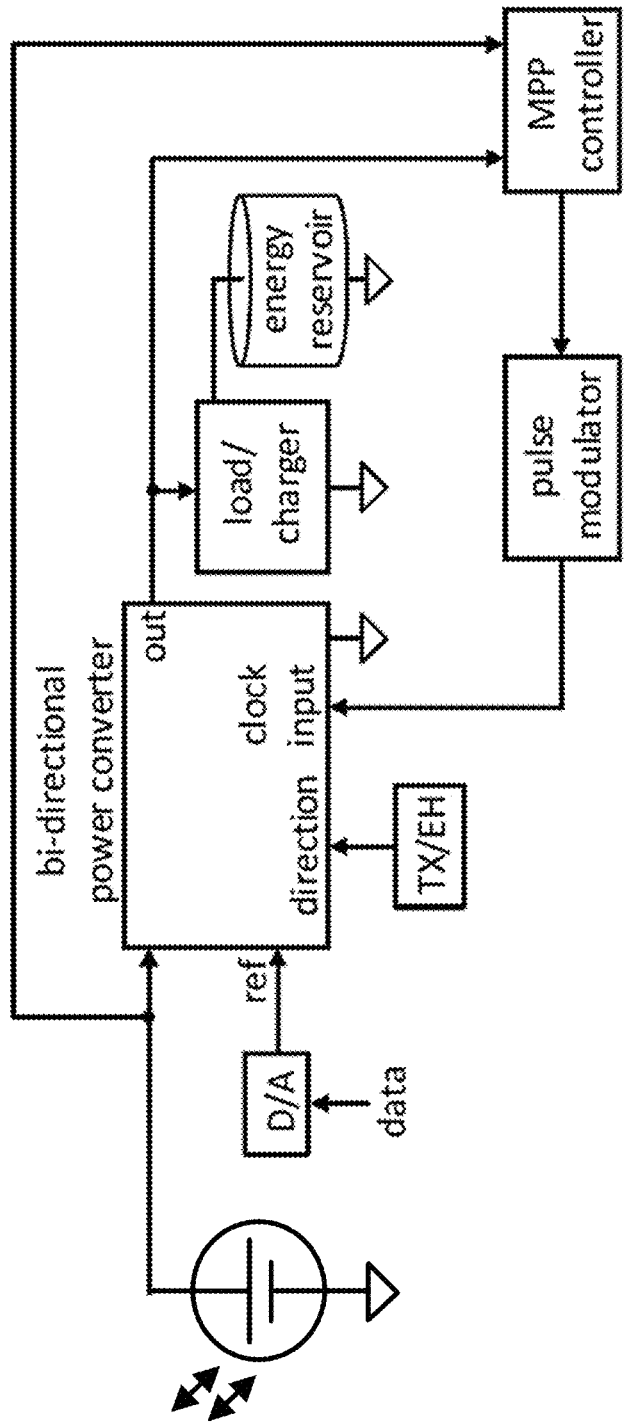
FIG. 23 is an embodiment of the EL modulation circuit, according to the present disclosure.

Referring to FIG. 23, another embodiment of the EL modulator is presented. This EL modulator uses a bidirectional power converter with variable reference voltage input (ref). The TX/EH signal sets the operation mode of the circuit. The operation mode can be set to data transmission (TX) or to energy harvesting (EH). The TX/EH signal sets the direction of power converter. In the forward direction the power converter transfers energy from the solar cell to the load or to a charger (EH mode). In the reverse direction the power converter transfers energy from the energy reservoir toward the solar cell (TX mode). The reference input voltage (ref) of the power converter is set such that the current through the solar cell varies according to the data being transmitted.

Figure 24:
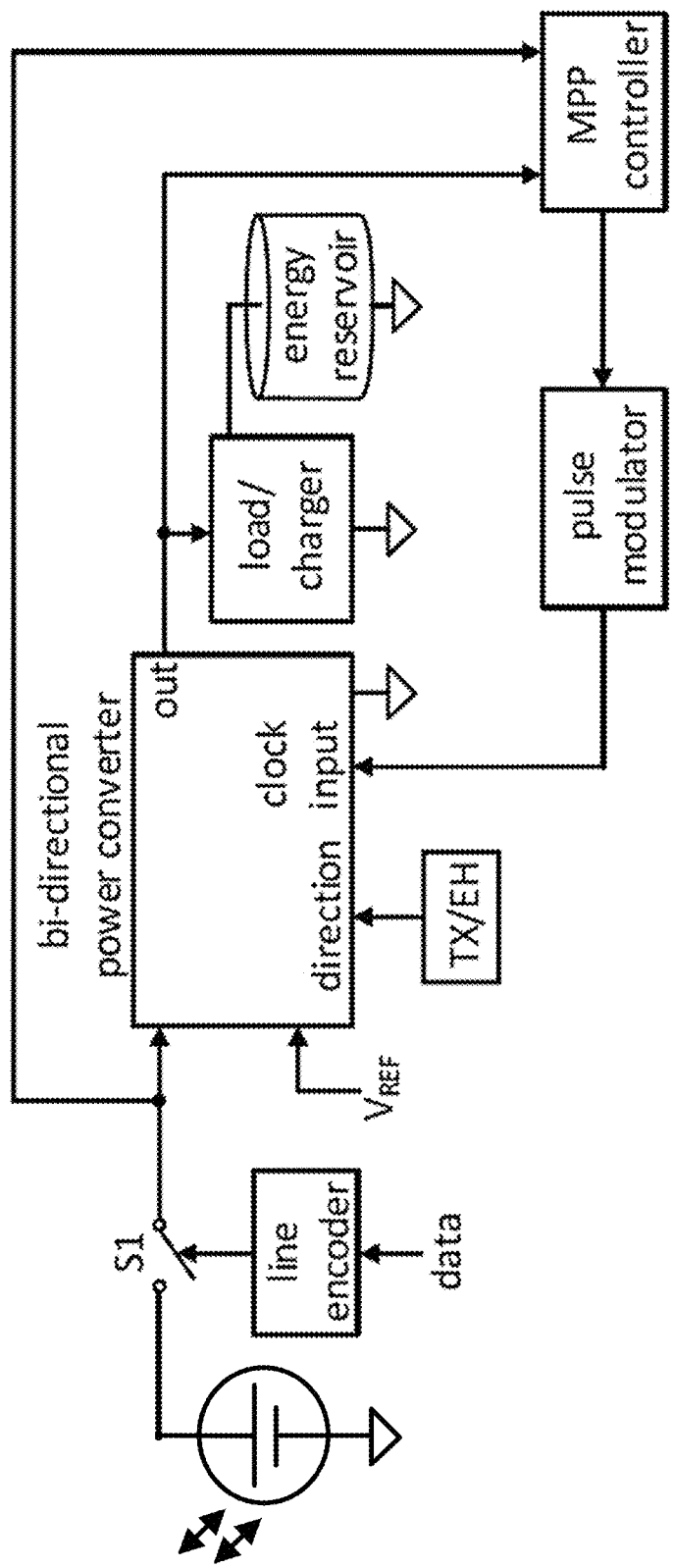
FIG. 24 is an embodiment of the EL modulation circuit, according to the present disclosure.

Referring to FIG. 24, another embodiment of the EL modulator is presented. This EL modulator uses a bidirectional power converter and a switch (S1) between the solar cell and the power converter. The TX/EH signal sets the operation mode of the circuit. The operation mode can be set to data transmission (TX) or to energy harvesting (EH). The TX/EH signal sets the direction of power converter. In the forward direction the power converter transfers energy from the solar cell to the load or to a charger (EH mode). In the reverse direction the power converter transfers energy from the energy reservoir toward the solar cell (TX mode). Switch S1 is controlled by the output of the line encoder. The reference input voltage of the power converter is set to a fixed value.

Figure 25:
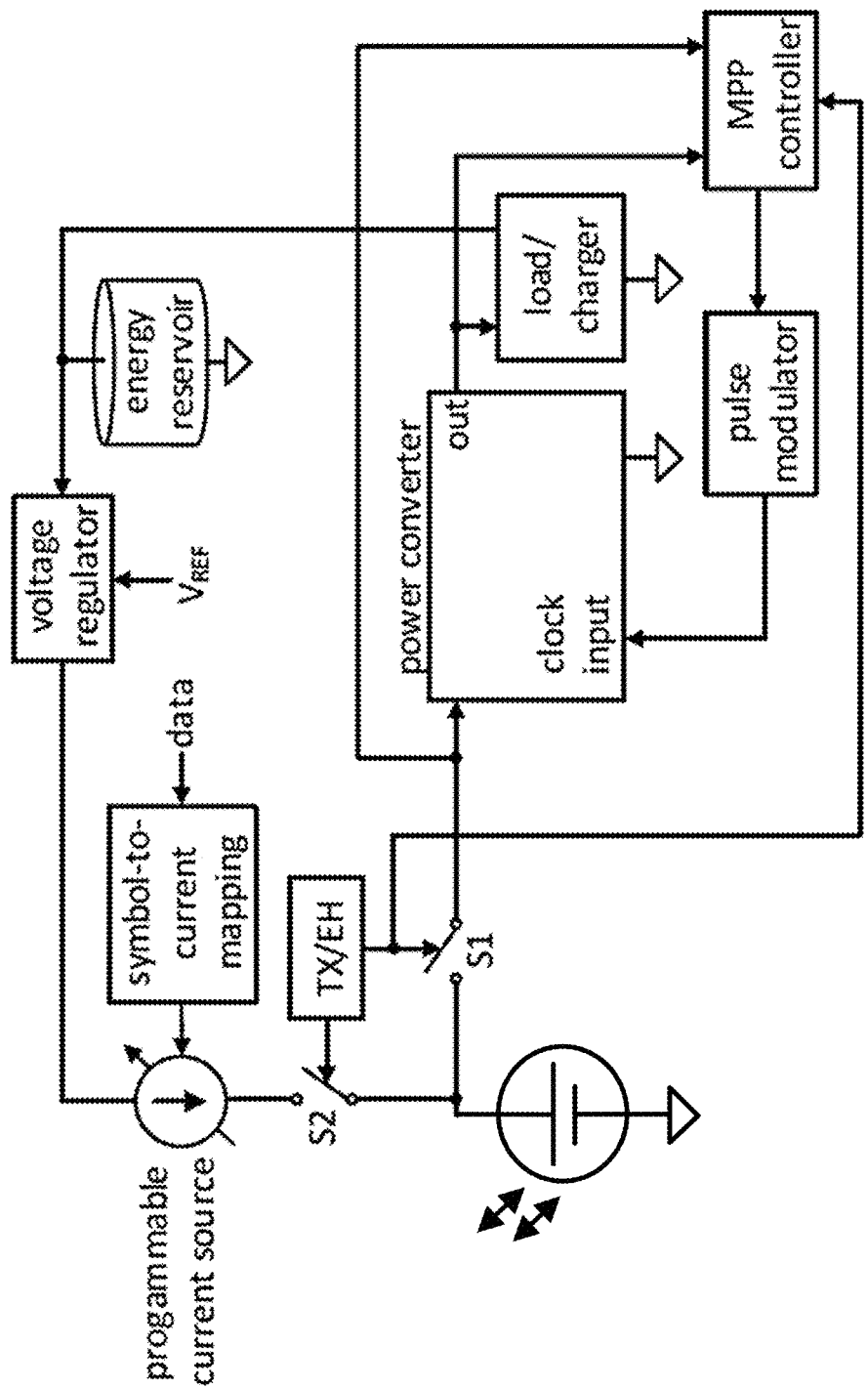
FIG. 25 is an embodiment of the EL modulation circuit, according to the present disclosure.

Referring to FIG. 25, another embodiment of the EL modulator is presented. This EL modulator uses a power converter, a programmable current source and two switches (S1 and S2). The TX/EH signal sets the operation mode of the circuit. The operation mode can be set to data transmission (TX) or to energy harvesting (EH). In EH mode S1 is closed, S2 is open and the MPP controller is enabled. In TX mode S1 is open, S2 is closed and the MPP controller is disabled. In TX mode the current generated by the programmable current source is a function of the data being transmitted.

Figure 26:
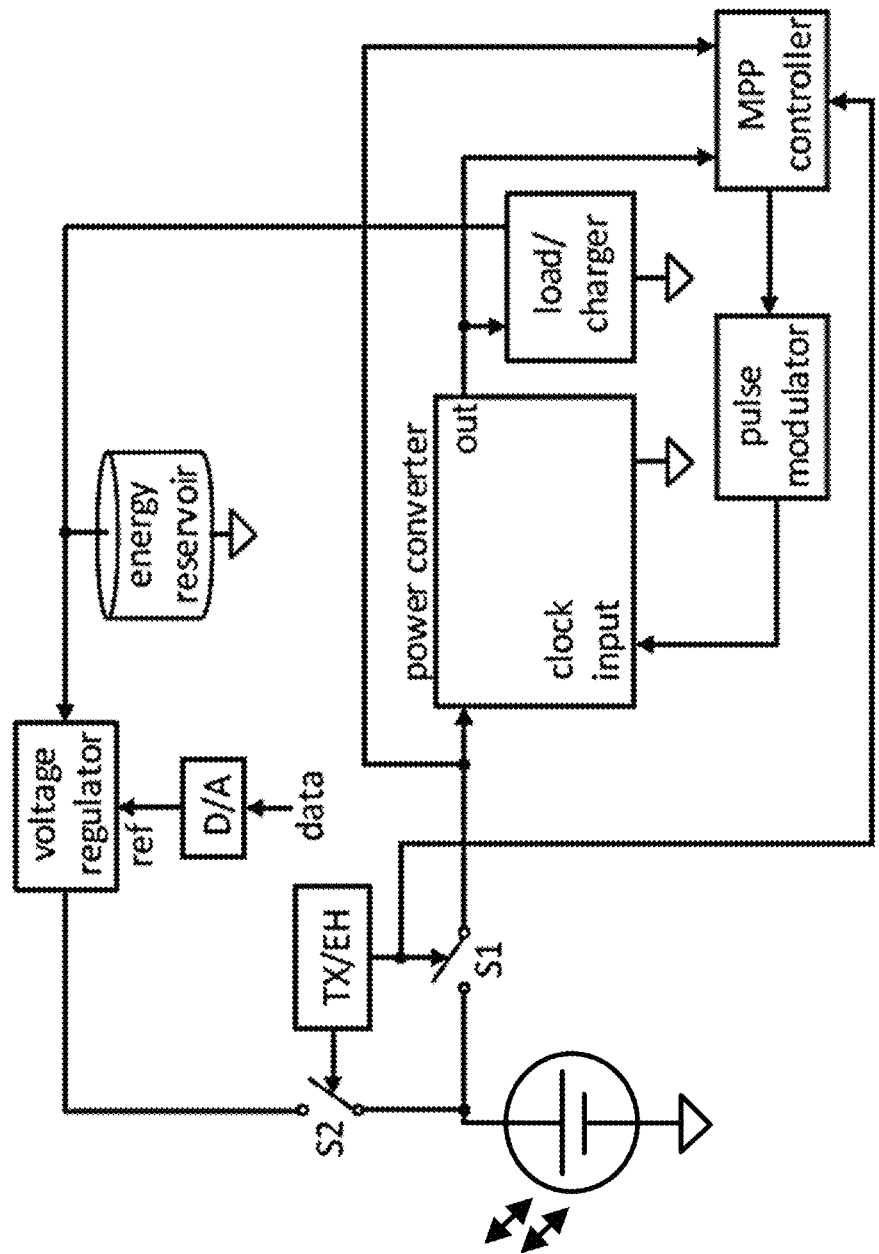
FIG. 26 is an embodiment of the EL modulation circuit, according to the present disclosure.

Referring to FIG. 26, another embodiment of the EL modulator is presented. This EL modulator uses a power converter, a voltage regulator and digital-to-analog converter (D/A). The TX/EH signal sets the operation mode of the circuit. The operation mode can be set to data transmission (TX) or to energy harvesting (EH). In EH mode S1 is closed, S2 is open and the MPP controller is enabled. In TX mode S1 is open, S2 is closed and the MPP controller is disabled. The reference input voltage (ref) of the voltage regulator is set such that the current through the solar cell varies according to the data being transmitted.

Figure 27:
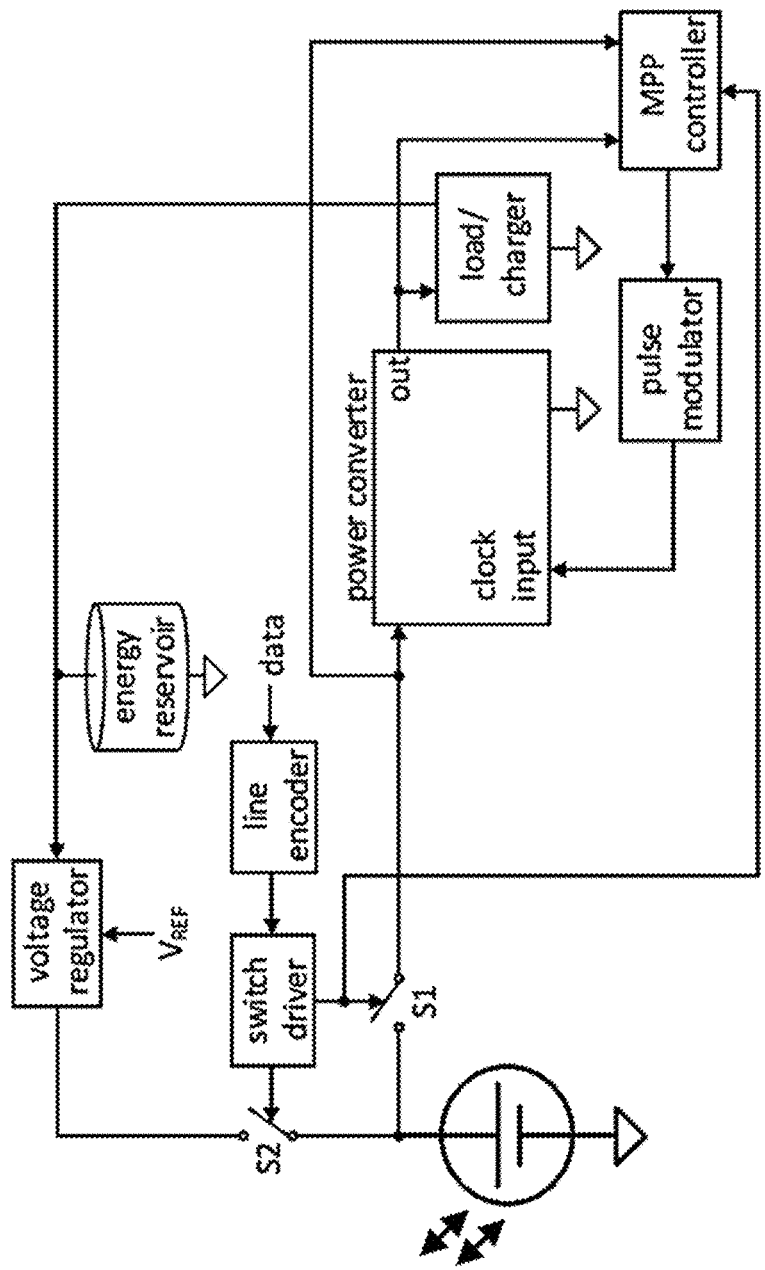
FIG. 27 is an embodiment of the EL modulation circuit, according to the present disclosure.

Referring to FIG. 27, another embodiment of the EL modulator is presented. This EL modulator uses a power converter, a voltage regulator and two switches (S1 and S2). The circuit operates in two modes: transmission mode (TX) and energy harvesting mode (EH). In EH mode S1 is closed, S2 is open and the MPP controller is enabled. In TX mode there are two sub-modes: No ambient light: in this sub-mode S1 remains open and S2 opens and closes according to the data being transmitted. Ambient light present: in this sub-mode S1 and S2 open and close out of phase according to the data being transmitted. The MPP controller is enabled whenever S1 is closed. The reference input voltage (VREF) of the voltage regulator is set to a constant value.

Those having ordinary skill in the art will recognize that numerous modifications can be made to the specific implementations described above. The implementations should not be limited to the particular limitations described. Other implementations may be possible.

The invention claimed is:

1. An apparatus, comprising:
(a) a semiconductor device selectively operable to generate electric charge from impinging photons onto the semiconductor device while in a first configuration and to emit light while in a second configuration;
(b) an energy-harvesting reservoir configured to store the electric charge;
(c) a bi-directional power converter configured to receive an input signal, wherein the bi-directional power converter is switchable via at least one switching element associated with the bi-directional power converter between an energy harvesting mode and a light emitting mode based upon the input signal, wherein:
  i) in the energy harvesting mode, the bi-directional power converter operates the semiconductor device in the first configuration, and
  ii) in the light emitting mode, the bi-directional power converter operates the semiconductor device in the second configuration; and
(d) a voltage source configured to accept a first input signal and selectively generate a voltage signal output sourced from the energy-harvesting reservoir, wherein the first input signal includes a binary data signal configured to control the voltage signal output, wherein the voltage source is electrically coupled with the semiconductor device and operable to forward bias the semiconductor device.

2. The apparatus of claim 1, wherein the semiconductor device includes a light emitting diode (LED).

3. The apparatus of claim 1, wherein the semiconductor device includes a solar cell.

4. The apparatus of claim 3, wherein the solar cell is configured to communicate via photo-luminescence while in the first configuration.

5. The apparatus of claim 3, wherein the solar cell is configured to communicate via electro-luminescence while in the second configuration.

6. The apparatus of claim 1, comprising:
a programmable current source configured to accept a second input signal and selectively generate an electrical current output sourced from the energy-harvesting reservoir, wherein the second input signal includes a binary data signal configured to control the electrical current output, wherein the current source is electrically coupled with the semiconductor device and is operable to forward bias the semiconductor device.

7. An apparatus, comprising:
(a) a semiconductor device selectively operable to generate electric charge from impinging photons onto the semiconductor device while in a first configuration and to emit light while in a second configuration;
(b) an energy-harvesting reservoir configured to store the electric charge;
(c) a bi-directional power converter configured to receive an input signal, wherein the bi-directional power converter is switchable via at least one switching element associated with the bi-directional power converter between an energy harvesting mode and a light emitting mode based upon the input signal, wherein:
  i) in the energy harvesting mode, the bi-directional power converter operates the semiconductor device in the first configuration, and
  ii) in the light emitting mode, the bi-directional power converter operates the semiconductor device in the second configuration; and
(d) a current source configured to accept a second input signal and selectively generate an electrical current output sourced from the energy-harvesting reservoir, wherein the second input signal includes a binary data signal configured to control the electrical current output, wherein the current source is electrically coupled with the semiconductor device and is operable to forward bias the semiconductor device.

8. The apparatus of claim 7, wherein the semiconductor device includes a light emitting diode (LED).

9. The apparatus of claim 7, wherein the semiconductor device includes a solar cell.

10. The apparatus of claim 9, wherein the solar cell is configured to communicate via photo-luminescence while in the first configuration.

11. The apparatus of claim 9, wherein the solar cell is configured to communicate via electro-luminescence while in the second configuration.

12. The apparatus of claim 7, comprising:
a voltage regulator configured to accept a first input signal and selectively generate voltage signal output sourced from the energy-harvesting reservoir, wherein the first input signal includes a binary data signal configured to control the voltage signal output, wherein the voltage source is electrically coupled with the semiconductor device and is operable to forward bias the semiconductor device.

13. An apparatus, comprising:
(a) a semiconductor device selectively operable to generate electric charge from impinging photons onto the semiconductor device while in a first configuration and to emit light while in a second configuration;
(b) an energy-harvesting reservoir configured to store the electric charge;
(c) a bi-directional power converter configured to receive an input signal, wherein the bi-directional power converter is switchable via at least one switching element associated with the bi-directional power converter between an energy harvesting mode and a light emitting mode based upon the input signal, wherein:
 i) in the energy harvesting mode, the bi-directional power converter operates the semiconductor device in the first configuration, and
 ii) in the light emitting mode, the bi-directional power converter operates the semiconductor device in the second configuration; and
(d) a voltage source configured to accept a first input signal and selectively generate voltage signal output sourced from the energy-harvesting reservoir, wherein the first input signal is configured to control the voltage signal output, wherein the voltage source is electrically coupled with the semiconductor device and is operable to forward bias the semiconductor device; and
(e) a current source configured to accept a second input signal and selectively generate an electrical current output sourced from the energy-harvesting reservoir, wherein the second input signal controls the electrical current output, wherein the current source is electrically coupled with the semiconductor device and is operable to forward bias the semiconductor device.

14. The apparatus of claim 13, wherein the semiconductor device includes a light emitting diode (LED).

15. The apparatus of claim 13, wherein the semiconductor device includes a solar cell.

16. The apparatus of claim 15, wherein the solar cell is configured to communicate via photo-luminescence while in the first configuration.

17. The apparatus of claim 15, wherein the solar cell is configured to communicate via electro-luminescence while in the second configuration.

18. The apparatus of claim 13, wherein the first input signal includes a binary data signal.

19. The apparatus of claim 13, wherein the second input signal includes a binary data signal.

20. The apparatus of claim 13, wherein the energy-harvesting reservoir includes a battery.

* * * * *